(12) United States Patent
Asano et al.

(10) Patent No.: US 8,450,805 B2
(45) Date of Patent: *May 28, 2013

(54) COMPOUND SEMICONDUCTOR SWITCH CIRCUIT DEVICE

(75) Inventors: Tetsuro Asano, Gunma (JP); Mikito Sakakibara, Saitama (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 1859 days.

This patent is subject to a terminal disclaimer.

(21) Appl. No.: 11/314,178

(22) Filed: Dec. 22, 2005

(65) Prior Publication Data

US 2006/0163659 A1  Jul. 27, 2006

(30) Foreign Application Priority Data

Dec. 22, 2004 (JP) ................................. 2004-371832

(51) Int. Cl.
*H01L 23/62* (2006.01)

(52) U.S. Cl.
USPC ............................ 257/357; 257/194; 257/356

(58) Field of Classification Search
USPC .................................................. 257/194, 358
See application file for complete search history.

(56) References Cited

U.S. PATENT DOCUMENTS

| 4,261,004 A | 4/1981 | Masuhara et al. |
| 4,339,285 A | 7/1982 | Pankove |
| 4,387,386 A | 6/1983 | Garver |
| 4,626,802 A | 12/1986 | Gailus |
| 4,745,445 A | 5/1988 | Mun et al. |
| 4,803,527 A | 2/1989 | Hatta et al. |
| 4,843,440 A | 6/1989 | Huang |
| 4,965,863 A | 10/1990 | Cray |
| 5,047,355 A | 9/1991 | Huber et al. |
| 5,157,573 A | 10/1992 | Lee et al. |
| 5,371,405 A | 12/1994 | Kagawa |
| 5,374,899 A | 12/1994 | Griffiths et al. |
| 5,559,363 A | 9/1996 | Immorlica, Jr. |
| 5,654,860 A | 8/1997 | Casper et al. |
| 5,684,323 A | 11/1997 | Tohyama |
| 5,821,827 A | 10/1998 | Mohwinkel et al. |
| 5,841,184 A | 11/1998 | Li |

(Continued)

FOREIGN PATENT DOCUMENTS

| CN | 1492585 | 4/2004 |
| DE | 3334167 | 4/1985 |

(Continued)

OTHER PUBLICATIONS

Miyawaki, Yasuo et al. (1986) "Ion-Implanted Low Noise Dual Gate GaAs MESFET," Sanyo Technical Review 18(2), pp. 76-84.

(Continued)

*Primary Examiner* — Howard Weiss
*Assistant Examiner* — Tifney Skyles
(74) *Attorney, Agent, or Firm* — Morrison & Foerster LLP

(57) ABSTRACT

A high-resistance element is connected as a part of a control resistor between a control terminal pad and a protecting element, immediately near the control terminal pad. Thus, even if a high-frequency analog signal leaks to the control resistor, the leaked signal is attenuated by the high-resistance element. This substantially eliminates the possibility of the high-frequency analog signal transmitting to the control terminal pad. Accordingly, an increase in insertion loss can be suppressed.

12 Claims, 13 Drawing Sheets

U.S. PATENT DOCUMENTS

| | | | |
|---|---|---|---|
| 5,932,917 | A | 8/1999 | Miura |
| 5,986,863 | A | 11/1999 | Oh |
| 6,002,860 | A | 12/1999 | Voinigescu et al. |
| 6,265,756 | B1 | 7/2001 | Brockett et al. |
| 6,580,107 | B2 | 6/2003 | Asano et al. |
| 6,914,280 | B2 | 7/2005 | Asano et al. |
| 6,946,891 | B2 | 9/2005 | Asano et al. |
| 7,193,255 | B2 | 3/2007 | Asano |
| 2002/0024375 | A1 | 2/2002 | Asano et al. |
| 2002/0047177 | A1 | 4/2002 | Asano et al. |
| 2004/0077150 | A1 | 4/2004 | Tosaka |
| 2004/0130380 | A1 | 7/2004 | Asano et al. |
| 2004/0222469 | A1 | 11/2004 | Asano et al. |
| 2004/0223274 | A1 | 11/2004 | Asano et al. |
| 2005/0121730 | A1 | 6/2005 | Asano et al. |
| 2005/0263796 | A1 | 12/2005 | Asano |
| 2005/0274979 | A1 | 12/2005 | Asano |
| 2005/0277255 | A1 | 12/2005 | Asano |
| 2005/0285143 | A1 | 12/2005 | Asano |
| 2006/0151816 | A1 | 7/2006 | Asano et al. |
| 2006/0163609 | A1* | 7/2006 | Asano et al. .................. 257/192 |
| 2006/0164150 | A1 | 7/2006 | Asano |
| 2006/0252651 | A1 | 11/2006 | Asano et al. |
| 2006/0255403 | A1 | 11/2006 | Asano et al. |
| 2006/0289963 | A1 | 12/2006 | Asano et al. |
| 2012/0228738 | A1 | 9/2012 | Asano et al. |

FOREIGN PATENT DOCUMENTS

| | | |
|---|---|---|
| EP | 0140095 | 5/1985 |
| EP | 0700161 | 3/1996 |
| JP | 57-128983 | 8/1982 |
| JP | 60-86874 | 5/1985 |
| JP | 62-174975 | 7/1987 |
| JP | 02-162744 | 6/1990 |
| JP | 8-236549 | 9/1996 |
| JP | 2723936 | 11/1997 |
| JP | 11-220093 | 8/1999 |
| JP | 2002-368194 | 12/2002 |
| JP | 2004-103786 | 4/2004 |
| KR | 1998-043416 | 9/1998 |
| KR | 1998-065222 | 10/1998 |
| KR | 2002-93613 | 12/2002 |
| WO | WO-96/22613 | 7/1996 |
| WO | WO-97/45877 | 4/1997 |

OTHER PUBLICATIONS

S.M.Sze Physics of Semiconductor Devices. New York: John Wiley & Sons, 1981, vol. 2, pp. 117-122.

Anderson, W.R. et al. "ESD Protection under Wire Bonding Pads," EOS/ESD Symposium, Jan. 1, 1999, pp. 88-94.

European Search Report dated Jul. 6, 2009 directed towards foreign application No. 03794280.2; (3 pages).

Search Report dated Dec. 3, 2008 directed towards EP Application No. 02788677.9; 4 pages.

Office Action directed towards EP Application No. 02788677.9 mailed Mar. 5, 2009; 5 pages.

Search Report dated Sep. 21, 2009 directed towards EP Application No. 03 794 280.2; 6 pages.

Asano, T., U.S. Office Action, mailed Feb. 5, 2009, directed to U.S. Appl. No. 11/314,101; 7 pages.

Asano, T., U.S. Office Action, mailed Jun. 11, 2008, directed to U.S. Appl. No. 11/314,101; 9 pages.

Asano, T., U.S. Office Action, mailed Jan. 25, 2006, directed to U.S. Appl. No. 10/772,585; 7 pages.

Asano, T., U.S. Office Action, mailed Sep. 6, 2006, directed to U.S. Appl. No. 10/772,585; 7 pages.

Asano, T., U.S. Office Action, mailed Aug. 11, 2009, directed to U.S. Appl. No. 10/521,941; 5 pages.

Asano, T., U.S. Office Action, mailed Mar. 30, 2009, directed to U.S. Appl. No. 10/521,941; 8 pages.

Asano, T., U.S. Office Action, mailed Oct. 8, 2008, directed to U.S. Appl. No. 10/521,941; 8 pages.

Asano, T., U.S. Office Action, mailed Sep. 18, 2006, directed to U.S. Appl. No. 10/505,438; 15 pages.

Asano, T., U.S. Office Action, mailed Mar. 2, 2006, directed to U.S. Appl. No. 10/505,438; 14 pages.

* cited by examiner

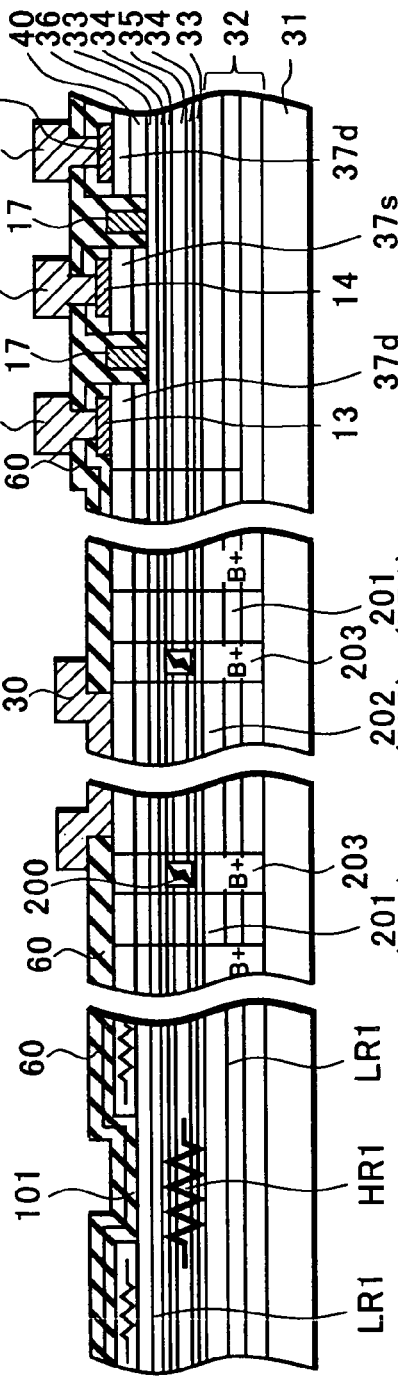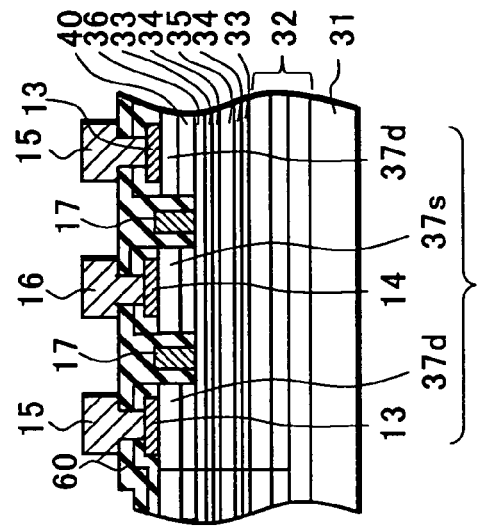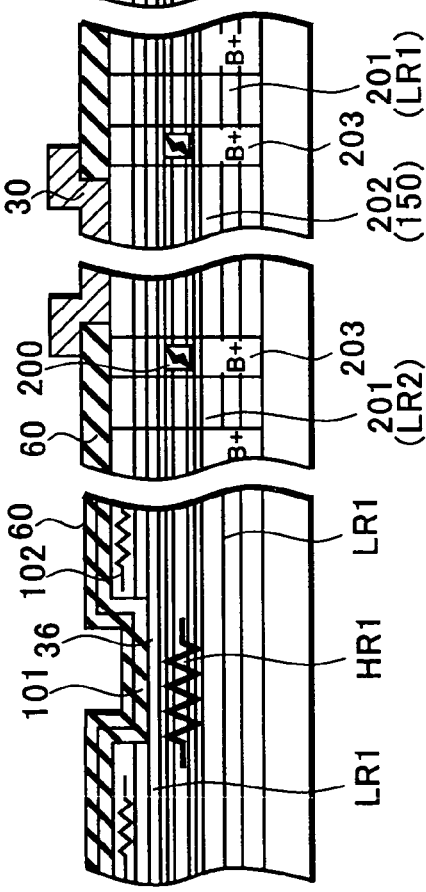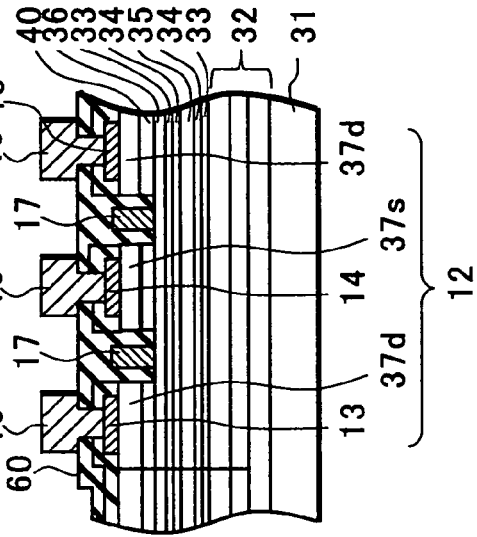

Prior Art

Prior Art

US 8,450,805 B2

COMPOUND SEMICONDUCTOR SWITCH CIRCUIT DEVICE

BACKGROUND OF THE INVENTION

1. Field of the Invention

The present invention relates to a compound semiconductor switch circuit device. In particular, the present invention relates to a compound semiconductor switch circuit device in which insertion loss is reduced.

2. Description of the Related Art

In mobile communication instruments such as cellular phones, microwaves in the GHz band are often used. In many cases, switch elements for switching among such high-frequency signals are used in antenna switch circuits and transmit-receive switch circuits. Since such switch elements deal with high frequencies, field-effect transistors (hereinafter referred to as "FETs") constructed using gallium arsenide (GaAs) are often used as the switch elements. Along with this, monolithic microwave integrated circuits (MMICs) are being developed into which the switch circuits themselves are integrated.

Further, as illustrated in FIGS. 13 and 14, a technology is known in which protecting elements 200 having n+/i/n+ structures are connected between two terminals of an element to be protected, in order to greatly improve electrostatic breakdown voltage in a compound semiconductor device.

FIG. 13 is a circuit diagram illustrating a compound semiconductor switch circuit device called a single-pole double-throw (SPDT) switch constructed using GaAs FETs.

The sources (or drains) of FET1 as a first FET and FET2 as a second FET are connected to a common input terminal IN. The gates of FET1 and FET2 are connected to first and second control terminals Ctl1 and Ctl2 through control resistors R1 and R2, respectively. The drains (or sources) of the FETs are connected to first and second output terminals OUT1 and OUT2, respectively.

FIG. 14 illustrates one example of a compound semiconductor chip into which the switch circuit device of FIG. 13 is integrated.

Pads I, O1, O2, C1, and C2 which respectively serve as the common input terminal IN, the first and second output terminals OUT1 and OUT2, and the first and second control terminals Ctl1 and Ctl2 are provided around FET1 and FET2 in a peripheral portion of a substrate. Source and drain electrodes 315 and 316 of FET1 are placed in a state in which comb-teeth-like portions are engaged. The gate electrode 317 thereof is placed between the source and drain electrodes 315 and 316.

A peripheral impurity region 350 for improving isolation is provided around each pad 330. Further, the control resistors R1 and R2, which are impurity regions, are placed near the common input terminal pad I and the first and second output terminal pads O1 and O2. Thus, protecting elements 200 having n+/i/n+ structures are connected between the common input terminal IN and the first control terminal Ctl1 (or second control terminal Ctl2) and between the first output terminal OUT1 (or second output terminal OUT2) and the first control terminal Ctl1 (or second control terminal Ctl2), and static electricity is discharged. This technology is described for instance in Japanese Patent Application Publication No. 2004-103786.

It is effective that electrostatic energy applied between the common input terminal IN and the first control terminal Ctl1 (or second control terminal Ctl2) is discharged immediately near the pads which serve as these terminals. Accordingly, it is desirable that protecting elements are connected in the vicinities of the pads.

The peripheral impurity regions 350 for improving isolation are respectively placed around the pads. Further, the first and second control terminal pads C1 and C2 are respectively connected to the gate electrodes of FET1 and FET2 using connecting paths. Each of these connecting paths is a resistor (control resistor) R1 (or R2) having a predetermined resistance value, which is constituted by an impurity region. The connecting paths prevent high-frequency signals from leaking from the gate electrodes to the control terminals, which are at GND potential for high frequencies.

Accordingly, the control resistor R1 (or R2) is placed along and near the common input terminal pad I to be spaced therefrom by a distance of 4 µm. Thus, a protecting element 200 including the control resistor R1 (or R2), the peripheral impurity region 350, and an insulating region (GaAs substrate) therebetween is connected between the common input terminal IN and the first control terminal Ctl1 (or second control terminal Ctl2). Accordingly, the above-described pattern can greatly improve electrostatic breakdown voltage.

However, there is the problem that insertion loss increases if the control resistor R1 (or R2) is brought close to the common input terminal pad I immediately near the first control terminal pad Ctl1 (or second control terminal pad Ctl2).

A high-frequency analog signal, which is an input signal, transmits through the common input terminal IN. However, since the control resistor R1 (or R2) is placed near the common input terminal pad I to be spaced therefrom by a distance of 4 µm, part of the input signal leaks to the control resistor R1 (or R2) in some cases. The first control terminal Ctl1 (or second control terminal Ctl2) to which the control resistor R1 (or R2) is connected is at GND potential for high frequencies. Accordingly, the high-frequency analog signal leaks to the first control terminal Ctl1 (or second control terminal Ctl2) through the control resistor R1 (or R2).

Essentially, the insertion loss of the switch MMIC is determined by only parasitic components in the FETs, i.e., parasitic resistive components, parasitic capacitive components, and parasitic inductive components of the FETs. Thus, the performance of the FETs directly determines the insertion loss of the switch MMIC.

However, in the pattern of FIG. 14, since the leakage of a high-frequency signal occurs because of a defect cause on a pattern layout other than the FETs, insertion loss increases accordingly. That is, the insertion loss of the switch MMIC having the pattern of FIG. 14 is 0.15 dB larger than that for the case where insertion loss is determined by only parasitic components of FETs. Thus, the deterioration of insertion loss has been a problem.

SUMMARY OF THE INVENTION

The present invention provides a compound semiconductor switch circuit device that includes two or more switching elements formed on a compound semiconductor substrate, each of the switching elements comprising at least one gate, a signal input portion and a signal output portion, a common input terminal pad formed on the substrate and connected with the signal input portions of the switching elements, an output terminal pad provided for each of the switching elements and connected with a corresponding signal output portion, the output terminal pads being formed on the substrate, a control terminal pad provided for each of the switching elements and connected with a corresponding gate, the control terminal pads being formed on the substrate, a connecting path connecting one of the control terminal pads and a corresponding gate, and a protecting element connected between the common input terminal pad and the connecting path and comprising a first conduction region, a second conduction region and an insulating region disposed between the first and second conduction regions, wherein the connecting path comprises a high-resistance element that has a resistance higher than an average resistance of the connecting path and is disposed between the protecting element and the control terminal pad with which the connecting path is connected.

BRIEF DESCRIPTION OF THE DRAWINGS

FIG. 7 is a cross-sectional view for explaining a third embodiment of the present invention.

FIG. 8 is a cross-sectional view for explaining a fourth embodiment of the present invention.

DESCRIPTION OF THE PREFERRED EMBODIMENTS

Embodiments of the present invention will be described in detail with reference to FIGS. 1 to 12B.

First, referring to FIGS. 1 to 4, a first embodiment of the present invention will be described by taking as an example the case where an SPDT switch circuit device includes two switching elements.

Figure 1:
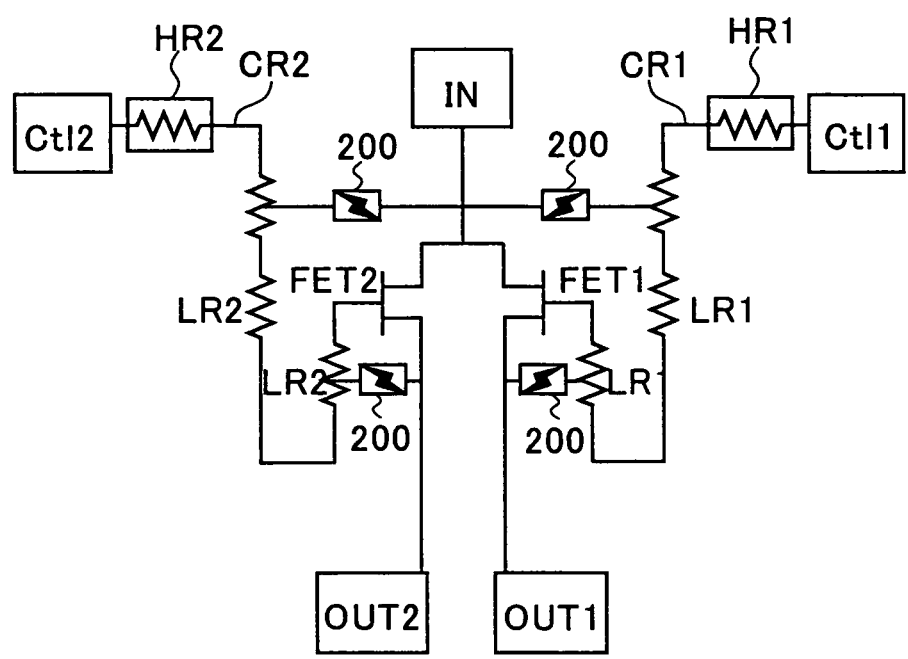
FIG. 1 is a circuit diagram for explaining a first embodiment of the present invention.

FIG. 1 is a circuit diagram illustrating a compound semiconductor switch circuit device. Source electrodes (or drain electrodes) of FETs (FET1 and FET2), which are two switching elements, are connected to a common input terminal IN. Gate electrodes of FET1 and FET2 are connected to a first control terminal Ctl1 and a second control terminal Ctl2 through a first connecting path and a second connecting path, respectively.

Further, drain electrodes (or source electrodes) of FET1 and FET2 are connected to a first output terminal OUT1 and a second output terminal OUT2, respectively. Control signals applied to the first and second control terminals Ctl1 and Ctl2 are complementary signals. Of the FETs, one to which an H-level signal is applied is turned on, whereby a high-frequency analog signal inputted to the common input terminal IN is transmitted to either of the output terminals. The first and second connecting paths are a first control resistor CR1 and a second control resistor CR2 formed by impurity regions, respectively. The first and second control resistors CR1 and CR2 are placed in order to prevent high-frequency signals from leaking through the gate electrodes to the DC potentials of the control terminals Ctl1 and Ctl2, which are AC grounded.

Figure 2A:
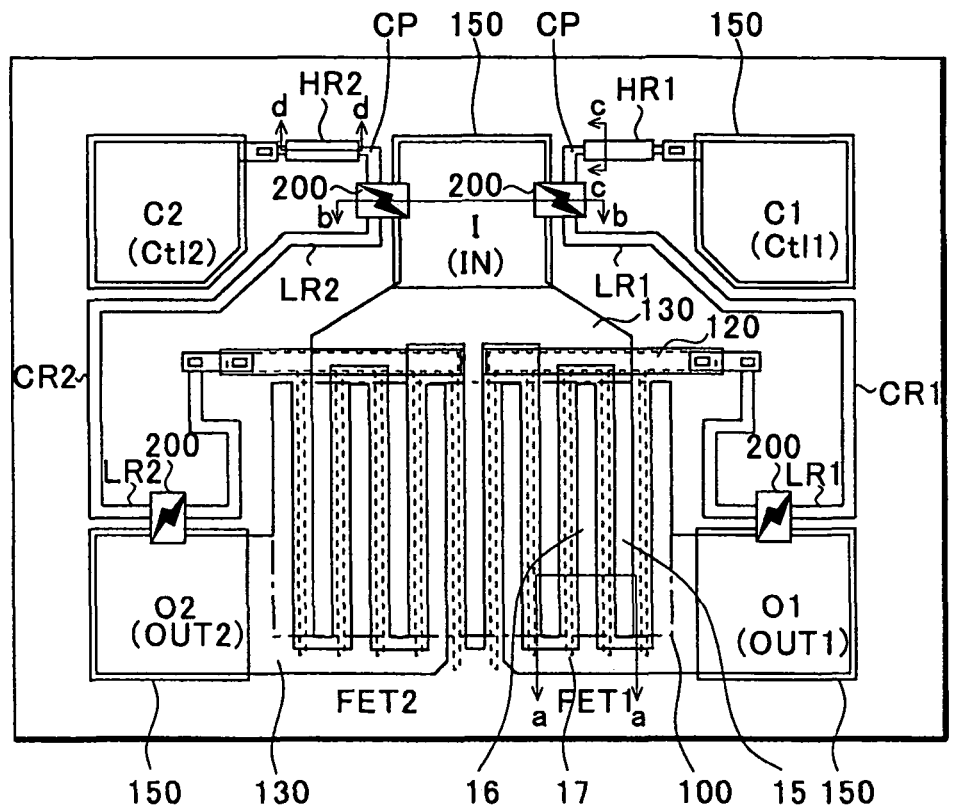
FIGS. 2A and 2B are a plan view and a cross-sectional view for explaining the first embodiment of the present invention, respectively.
Figure 2B:
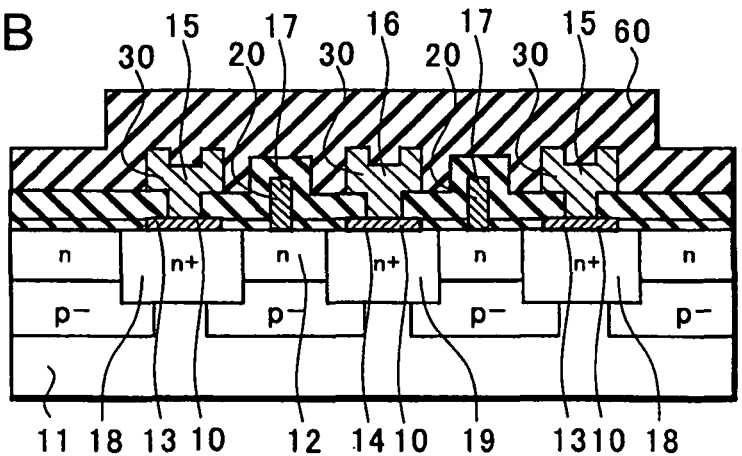

FIGS. 2A and 2B illustrate one example of a compound semiconductor chip into which the compound semiconductor switch circuit device illustrated in FIG. 1 is integrated. FIG. 2A is a plan view, and FIG. 2B is a cross-sectional view taken along line a-a in an operating region.

As illustrated in FIG. 2A, the two FETs (FET1 and FET2), which performs switching, are placed in a GaAs substrate 11. Further, pads I, O1, O2, C1, and C2 which respectively connect to the common input terminal IN, the first and second output terminals OUT1 and OUT2, and the first and second control terminals Ctl1 and Ctl2 are provided in a peripheral portion of the substrate 11.

A second metal layer indicated by dotted lines is a gate metal layer (e.g., Pt/Mo) 20 formed simultaneously with the formation of the gate electrodes of the FETs. A third metal layer indicated by full lines is a pad metal layer (Ti/Pt/Au) 30 which connects elements and forms the pads. A first metal layer is an ohmic metal layer (AuGe/Ni/Au) which forms an ohmic contact to the substrate 11, and forms the source and drain electrodes of the FETs, and the like. However, the first metal layer is overlapped by the pad metal layer 30 and therefore is not illustrated in FIG. 2A.

FET1 is formed in an operating region 100 surrounded by dashed-dotted lines. It should be noted that the first control terminal pad C1, the first control resistor CR1, and the first output terminal pad O1 on the FET1 side are placed to be symmetric with the second control terminal pad C2, the second control resistor CR2, and the second output terminal pad O2 on the FET2 side with respect to a center line of the chip. Accordingly, although the FET1 side will be described below, the following description also applies to the FET2 side.

The operating region 100 is a rectangular region which is surrounded by dashed-dotted lines and in which ions of an n-type impurity are implanted into the GaAs substrate 11. In the operating region 100, a source region 18 and a drain region 19 are selectively formed (see FIG. 2B) which are formed by n-type impurity regions of high concentration.

In FET1, three comb-teeth-like portions of the pad metal layer 30 which are extended from the lower side constitute a second drain electrode 16 connected to the first output terminal pad O1. Under the second drain electrode 16, there is a first drain electrode formed by the ohmic metal layer. Further, three comb-teeth-like portions of the pad metal layer 30 which are extended from the upper side constitute a second source electrode 15 connected to the common input terminal pad I. Under the second source electrode 15, there is a first source electrode formed by the ohmic metal layer.

The second source and drain electrodes 15 and 16 are placed in a shape in which the comb-teeth-like portions are engaged. A gate electrode 17 formed by the gate metal layer 20 is placed therebetween in a shape having five comb-teeth-like portions to form a Schottky junction with part of the operating region 100. It should be noted that the comb-tooth-shaped source electrode 15 extended in a central portion from the upper side is common to FET1 and FET2. This contributes to the miniaturization of the chip.

Each comb-teeth-like portions of the gate electrode 17 of FET1 are bundled by a gate wiring 120 formed by the gate metal layer 20 outside the operating region 100, and are connected to the first control terminal pad C1 through the first control resistor CR1.

The source and drain electrodes of each FET have a two-layer electrode structure including the ohmic metal layer and the pad metal layer 30. The second source and drain electrodes 15 and 16 of the second layer are formed by the pad metal layer 30. Each comb-teeth-like portions of the second source electrode 15 and the second drain electrode 16 are bundled by pad wirings 130 formed by the pad metal layer 30 outside the operating region 100.

In the GaAs substrate 11, an n-type channel layer 12 is provided, and n-type impurity regions of high concentration which form the source and drain regions 18 and 19 are provided on both sides of the n-type channel layer 12. The gate electrode 17 forms a Schottky junction with the channel layer 12. Moreover, a first source electrode 13 and a first drain electrode 14 formed by an ohmic metal layer 10 of a first layer are provided in the source and drain regions 18 and 19. Further, the second source and drain electrodes 15 and 16 formed by the pad metal layer 30 are provided on the first source and drain electrodes 13 and 14 as described previously, and elements are wired (FIG. 2B).

In order to improve isolation, a peripheral impurity region 150, which is an impurity region of high concentration, is placed around each of the pads and the gate wiring 120. The peripheral impurity regions 150 are respectively connected to the pads in a state in which direct currents are allowed to flow (hereinafter referred to as "DC connected"). The peripheral impurity regions 150 are respectively provided in the entire areas under the pads (or provided around the pads) to be protruded from the pads. Alternatively, the peripheral impurity regions 150 may be provided around the pads to be spaced from the pads by distances of not more than 5 μm and may be DC connected to the pads through the semi-insulating substrate 11, respectively. Further, the peripheral impurity region 150 is also similarly DC connected to the gate wiring 120.

The first control resistor CR1 includes a low-resistance element LR1 which is a first conduction region. A high-resistance element HR1 which is a third conduction region is connected in series with portions of the low-resistance element LR1. That is, the high-resistance element HR1 constitutes part of the first control resistor CR1. Similarly, the second control resistor CR2 includes a low-resistance element LR2 which is the first conduction region. A high-resistance element HR2 which is the third conduction region is connected in series with portions of the low-resistance element LR2. That is, the high-resistance element HR2 constitutes part of the second control resistor CR2. It should be noted that the high-resistance elements HR1 and HR2 will be described later.

Here, the low-resistance element LR1 is an ion-implanted region and is an impurity region of high concentration (peak concentration: 1 to $1.5 \times 10^{18}$ cm$^{-3}$) which is comparable to those of the source and drain regions 18 and 19 of the operating region 100. The low-resistance element LR1 has a low sheet resistance of approximately 100 Ω/sq. and a resistance value of approximately 3 to 5 kΩ. In the ion-implanted region, the impurity concentration varies with depth. Accordingly, the impurity concentration of an ion-implanted region is typified by the peak concentration. The low-resistance element LR2 has a similar structure. It should be noted that the low-resistance element LR1 (or LR2) may be discontinuous and that part of the first control resistor CR1 (or second control resistor CR2) may be a metal wiring.

Further, protecting elements 200 are connected in the vicinities of the common input terminal pad I and the first output terminal pad OUT1.

Figure 3A:
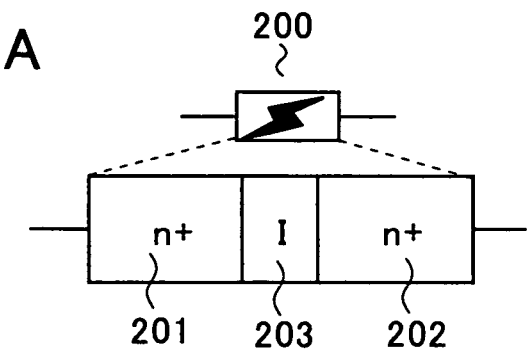
FIGS. 3A to 3C are a conceptual diagram, an equivalent circuit diagram, and a cross-sectional view for explaining the first embodiment of the present invention, respectively.
Figure 3B:
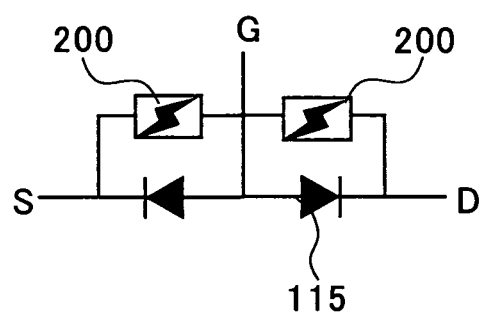
Figure 3C:
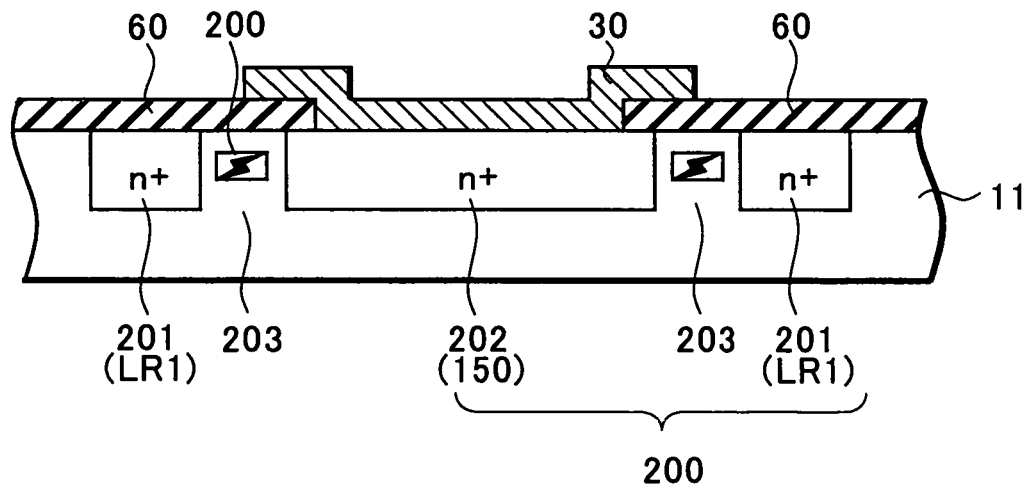

Here, the protecting elements 200 will be described. FIGS. 3A to 3C are diagrams illustrating the protecting elements 200. FIG. 3A is a conceptual diagram, FIG. 3B is a schematic circuit diagram, and FIG. 3C is a cross-sectional view taken along line b-b of FIG. 2A.

As illustrated in FIG. 3A, each protecting element 200 has a structure in which an insulating region 203 is placed between a first conduction region 201 and a second conduction region 202. The first and second conduction regions 201 and 202 are, for example, n-type impurity regions of high concentration.

The first conduction region (hereinafter referred to as a first n+ region) 201 and the second conduction region (hereinafter referred to as a second n+ region) 202 are provided to be spaced from each other by a distance over which electrostatic energy can be passed, e.g., a distance of approximately 4 μm. Both of the impurity concentrations thereof are not less than $1 \times 10^{17}$ cm$^{-3}$. Further, the insulating region 203 is placed between the first and second n+ regions 201 and 202 to be in contact therewith. Here, the insulating region 203 is not completely electrically insulator but is part of the semi-insulating substrate 11 or a region which is insulated by implanting ions of an impurity into the substrate 11. Further, it is desirable that the impurity concentration of the insulating region 203 is approximately not more than $1 \times 10^{14}$ cm$^{-3}$ and that the resistivity thereof is not less than $1 \times 10^6$ Ω·cm.

FIG. 3B is a diagram in which the portion of FET1 in FIG. 2A is replaced with an internal equivalent circuit. In each of the FETs constituting the switch MMIC, a gate Schottky junction is reverse biased when consideration is given to electrostatic breakdown voltage. That is, an equivalent circuit for this case is a circuit in which Schottky barrier diodes 115 are connected between a gate terminal G and a source terminal S and between the gate terminal G and a drain terminal D.

In each FET, a position at which electrostatic breakdown voltage is lowest is a Schottky junction portion (a gate Schottky junction) between the gate electrode and the operating region 100. That is, when electrostatic energy applied between the gate terminal G and the drain terminal D or between the gate terminal G and the source terminal S reaches the gate Schottky junction, if the electrostatic energy exceeds the electrostatic breakdown voltage between the gate and source terminals S and G or between the gate and drain terminals G and D, the gate Schottky junction is broken down.

Here, "between the common input terminal IN and the first control terminal Ctl1" corresponds to "between the source and gate terminals S and G of FET1" (or "between the drain and gate terminals D and G of FET1"). It should be noted that the FET2 side is similar.

That is, before electrostatic energy applied between the common input terminal IN and the first control terminal Ctl1 reaches a Schottky junction between the gate and drain terminal G and D or a Schottky junction between the gate and source terminals G and S of FET1, the electrostatic energy must be attenuated in the reaching process.

Accordingly, the protecting elements 200 are connected therebetween. This makes it possible to discharge electrostatic energy applied to the Schottky barrier diodes 115 through the protecting elements 200 and to prevent an electrostatic breakdown.

FIG. 3C is a cross-sectional view taken along line b-b of FIG. 2A. It should be noted that although not described below, the second control resistor CR2 side is also similar.

The low-resistance element LR1 constituting the first control resistor CR1 is, for example, an n-type impurity region (n+ region) of high concentration similar to the source and drain regions 18 and 19 of the operating region 100. Further, the peripheral impurity regions 150, which are fourth conduction regions, are respectively placed around the pads and the wirings connected to the pads. The peripheral impurity regions 150 are n-type impurity regions (n+ regions) of high concentration which are provided as countermeasures for isolation in order to prevent high-frequency signals from leaking from the pads and the wirings.

The peripheral impurity regions 150 are respectively DC connected to the pads and provided in the entire areas under the pads (or around the areas under the pads) to be protruded from the pads. Alternatively, the peripheral impurity regions 150 may be respectively provided around the pads to be spaced from the pads by distances of not more than approximately 5 μm.

The pad metal layer 30 (each pad) forms a Schottky junction with the semi-insulating GaAs substrate 11 as illustrated in FIG. 3C. The peripheral impurity regions 150 and the corresponding pads also form Schottky junctions, respectively.

As illustrated in FIG. 3C, the low-resistance element LR1 is placed to be spaced from the peripheral impurity region 150 of the common input terminal pad I by a distance of 4 μm. Thus, the protecting element 200 having an n+/i/n+ structure is formed in which the low-resistance element LR1 serves as the first n+ region 201, the peripheral impurity region 150 adjacent thereto serves as the second n+ region 202, and the semi-insulating substrate 11 serves as the insulating region 203. That is, the protecting element 200 is connected between the common input terminal IN and the control terminal Ctl1, i.e., between the source and gate terminals S and G of FET1 (or between the drain and gate terminals D and G thereof).

Further, the protecting element 200 can be connected near the common input terminal pad I and in a path to the operating region 100 from the first control terminal pad C1 to which a signal is applied. This makes it possible to attenuate electrostatic energy applied to the switch circuit device before the electrostatic energy reaches the operating region 100.

Here, the longer the distance by which the protecting element 200 is placed along the pad, the more electrostatic energy can be attenuated. Accordingly, this distance is preferably not less than 10 μm.

Thus, the protecting element 200 is connected between the common input terminal pad I and the first control terminal pad C1 to be close to the common input terminal pad I, whereby electrostatic breakdown voltage can be greatly improved.

Further, it is preferable that low-resistance element LR1 is placed near the first output terminal pad O1 and that another protecting element 200 is connected between the first control terminal Ctl1 and the first output terminal OUT1 (see FIG. 2A). Thus, the protecting elements 200 are connected both between the gate and drain terminals G and D of FET1 and between the gate and source terminals G and S thereof, and the minimum value of the electrostatic breakdown voltage of the switch circuit device can be improved.

Each protecting element 200 of this embodiment is an element which is connected by placing, for example, the peripheral impurity region 150 and the low-resistance element LR1 so that they become close to each other and which has a predetermined length. Further, an end portion, which is closer to the first control terminal pad C1, of each protecting element 200 on the path of the first control resistor CR1 is referred to as a connection point CP between the first control resistor CR1 and the protecting element 200. Further, this is the same in the second control resistor CR2.

Connecting the protecting elements 200 makes it possible to greatly improve the electrostatic breakdown voltage of the switch MMIC. On the other hand, as described previously, an input signal transmitting to the common input terminal pad I leaks to the first and second control terminal pads C1 and C2 through the low-resistance elements LR1 and LR2 placed near the common input terminal pad I.

For this reason, in this embodiment, the high-resistance elements HR1 and HR2 are respectively connected between the first control terminal Ctl1 and the connection point CP of the corresponding protecting element 200 and between the second control terminal Ctl2 and the connection point CP of the corresponding protecting element 200. Specifically, as illustrated in FIG. 2A, the high-resistance elements HR1 and HR2 are respectively connected between the first control terminal pad C1 and the corresponding protecting element 200 and between the second control terminal pad C2 and the corresponding protecting element 200 immediately near the first and second control terminal pads C1 and C2 within a distance of, for example, 100 μm therefrom.

Figure 4:
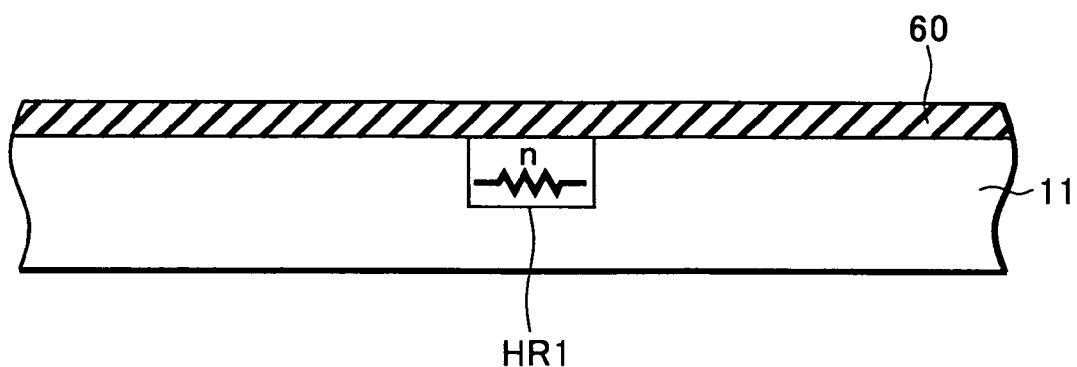
FIG. 4 is a cross-sectional view for explaining the first embodiment of the present invention.

FIG. 4 illustrates a cross-sectional view taken along line c-c of FIG. 2A.

As illustrated in FIG. 4, the high-resistance element HR1 is an n-type impurity region of relatively low concentration (peak concentration: 2 to $4 \times 10^{17}$ cm$^{-3}$) which is comparable to that of the channel layer 12 of the operating region 100. The high-resistance element HR1 has a sheet resistance of approximately 1 kΩ/sq (high sheet resistance) and a resistance value of not less than 5 kΩ (e.g., 10 kΩ). The high-resistance element HR2 also have similar structure. It should be noted that in this embodiment, the rectangles respectively indicating the high-resistance elements HR1 and HR2 have no meaning in terms of a pattern in themselves in FIG. 2A.

Further, the high-resistance elements HR1 and HR2 are respectively connected between the first control terminal pad C1 and the corresponding protecting element 200 connected to the common input terminal pad I and between the second control terminal pad C2 and the corresponding protecting element 200 connected to the common input terminal pad I, immediately near the first and second control terminal pads C1 and C2. That is, the high-resistance element HR1 (or HR2) is connected on a path from the first control terminal pad C1 (or second control terminal pad C2) to the protecting element 200 connected at a position closest to the first control terminal pad C1 (or second control terminal pad C2).

This makes it possible to reliably attenuate high-frequency signals leaking to the first and second control resistors CR1 and CR2. It should be noted that although not described below, the second control resistor CR2 side is also similar. The first control resistor CR1 has the high-resistance element HR1 connected in series therewith, and includes the low-resistance element LR1 and a wiring formed by the pad metal layer 30 and the like.

As described previously, components of an input signal (high-frequency analog signal) transmitting to the common input terminal pad I which leak to the first control resistor CR1 through the protecting element 200 account for a major part of the leakage of high-frequency signals. However, in practice, although small in amount, high-frequency signals also leak through the substrate 11 to the connecting paths from the pad wirings 130, electrodes, the operating region 100, and the like in which high-frequency signals are transmitted. For example, when a high-frequency signal having a power as high as several watts transmits, the leakage components thereof are not negligible. That is, in the case where the high-resistance element HR1 is connected at a position far from the first control terminal pad C1 and, for example, a low-resistance element or a wiring or the like is connected between the high-resistance element HR1 and the first control terminal pad C1, a high-frequency signal leaks through the substrate 11 to the low-resistance element or the like from the pad wirings 130, electrodes, the operating region 100, and the like in which the high-frequency signal is transmitted. Further, the leaked high-frequency signal leaks to the first control terminal pad C1 without being attenuated.

Accordingly, as in this embodiment, a high-resistance element is connected immediately near the first control terminal pad C1 within a distance of 100 µm therefrom. Thus, even if there are the low-resistance element LR1 and the like through which high-frequency signals leak, the distance (distance from the high-resistance element to the first control terminal pad C1) becomes short, and the chance that high-frequency signals leak is small.

That is, in the first and second control resistors CR1 and CR2 which respectively connect the first and second control terminal pads C1 and C2 of the switch MMIC to the gate electrodes 17 and which serve as control signal lines, the high-resistance elements HR1 and HR2 of not less than 5 kΩ are respectively connected in the vicinities of the first and second control terminal pads C1 and C2.

By adopting the above-described layout, even if a high-frequency analog signal leaks from the common input terminal pad I to the low-resistance element LR1 (or LR2), the leaked signal is attenuated by the high-resistance element HR1 (or HR2) of not less than approximately 5 kΩ. Accordingly, the leaked high-frequency signal actually does not reach the first control terminal pad C1 (or second control terminal pad C2). Thus, a high-frequency signal from the common input terminal pad I does not leak to the first control terminal pad C1 (or second control terminal pad C2), which is at GND potential for high frequencies. That is, an increase in insertion loss between the common input terminal IN and the first output terminal OUT1 (or second output terminal OUT2) can be suppressed.

Moreover, the high-resistance elements HR1 and HR2 have impurity concentrations which are comparable to that of the channel layer 12 as described previously. Thus, a higher resistance value can be obtained with a shorter distance. Accordingly, the high-resistance elements HR1 and HR2 can be placed in free spaces around pads, and the increase in the insertion loss can be suppressed without increasing the chip size. Further, the high-resistance elements HR1 and HR2 can be formed by merely changing a mask pattern for forming the channel layer 12 in the process.

In order to obtain a high resistance value (not less than 5 kΩ) using only the low-resistance element LR1 (or LR2), it is necessary to sufficiently reduce the width thereof or to ensure a sufficient length. In actual cases, since there are limitations on the fining of patterning, it is necessary to ensure a desired resistance value by ensuring the length. However, a resistor of not less than 5 kΩ cannot be contained in a space on a path from the connection point CP to the control terminal pad C1 or that from the connection point CP to the control terminal pad C2. Accordingly, there arises the necessity of preparing a special space only for placing a resistor of not less than 5 kΩ, and the chip area is increased. Accordingly, resistors of not less than 5 kΩ are respectively constructed using the high-resistance elements HR1 and HR2 as in this embodiment. This eliminates the necessity of particularly increasing the chip size, because the resistors of not less than 5 kΩ can be sufficiently contained in spaces on a path from the connection point CP to the control terminal pad C1 and that from the connection point CP to the control terminal pad C2.

As described above, in this embodiment, the protecting element 200 is connected between the first control terminal Ctl1 (or second control terminal Ctl2) and the common input terminal IN. The protecting element 200 includes the low-resistance element LR1 (or LR2) placed near the common input terminal pad IN, the peripheral impurity region 150, and the GaAs substrate 11.

This makes it possible to greatly improve electrostatic breakdown voltage. However, on the other hand, since the common input terminal pad I and the low-resistance element LR1 (or LR2) are close to each other, there are cases where a high-frequency analog signal as an input signal leaks to the first control terminal pad C1 (or second control terminal pad C2).

To counter this, the high-resistance element HR1 (or HR2) having a resistance value of not less than 5 kΩ is connected as a part of the first control resistor CR1 (or the second control resistor CR2) between the protecting element 200 and the first control terminal pad C1 (or the second control terminal pad C2). Thus, in the case where a high-frequency analog signal leaks to the low-resistance element LR1 (or LR2), which is one terminal of the protecting element 200, the high-frequency analog signal can be attenuated by the high-resistance element HR1 (or HR2). This substantially eliminates the possibility of a high-frequency analog signal leaking to the first control terminal pad C1 (or the second control terminal pad C2). Accordingly, the insertion loss between the common input terminal IN and the first output terminal OUT1 (or second output terminal OUT2) can be prevented from deteriorating by the high-resistance element HR1 (or HR2) while electrostatic breakdown voltage is greatly improved by the protecting element 200.

Next, a second embodiment will be described with reference to FIGS. 5A to 6B. In the second embodiment, HEMTs (High Electron Mobility Transistors) are adopted as two switching elements. It should be noted that the portions which overlap with those of the first embodiment will not be described.

Figure 5A:
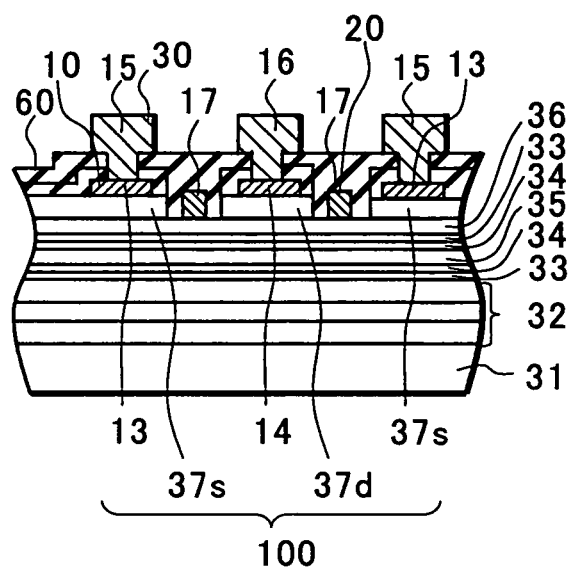
FIG. 5 is a cross-sectional view for explaining a second embodiment of the present invention.
Figure 5B:
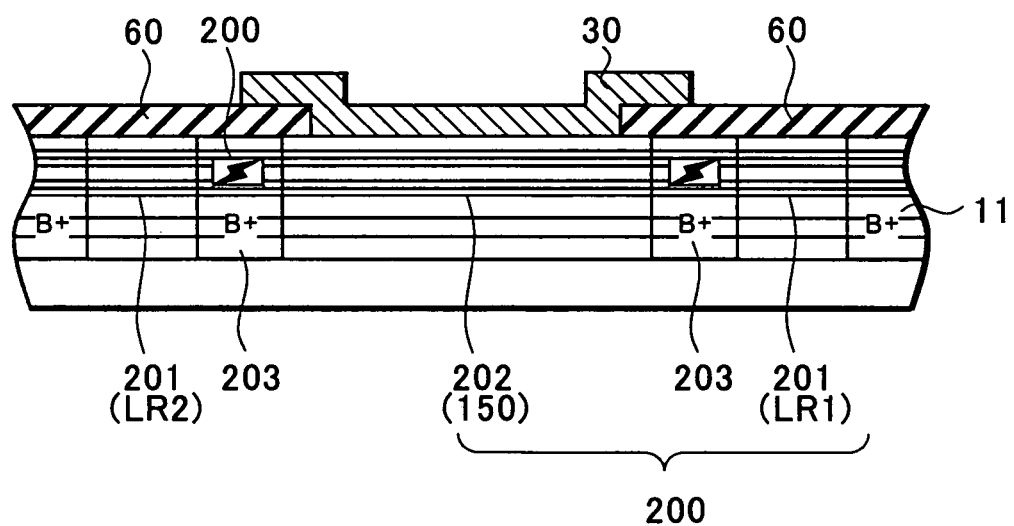

Also in the case of HEMTs, a circuit diagram and a plan view of a switch circuit device are the same as those of FIGS. 1 and 2A. FIGS. 5A and 5B illustrate cross-sectional views taken along lines a-a and b-b of FIG. 2A, respectively.

FIG. 5A illustrates a substrate in which an undoped buffer layer 32 is stacked on a semi-insulating GaAs substrate 31 and in which an n+ AlGaAs layer 33 serving as an electron supply layer, an undoped InGaAs layer 35 serving as a channel (electron transit) layer, and the n+AlGaAs layer 33 serving as an electron supply layer are stacked in this order on the buffer layer 32. A spacer layer 34 is placed between each electron supply layer 33 and the channel layer 35.

The buffer layer 32 is a high-resistance layer to which no impurity is added, and the thickness thereof is approximately several thousand angstroms. On the electron supply layer 33, an undoped AlGaAs layer serving as a barrier layer 36 is stacked to ensure a predetermined breakdown voltage and a predetermined pinch-off voltage. Further, an n+ GaAs layer 37 serving as a cap layer is stacked on as the uppermost layer. An impurity is added to the cap layer 37 at high concentration. The impurity concentration is approximately 1 to $5\times10^{18}$ cm$^{-3}$.

For the electron supply layers 33, the barrier layer 36, and the spacer layers 34, materials having band gaps larger than that of the channel layer 35 are used. Further, an n-type impurity (e.g., Si) is added to the electron supply layers 33 at a concentration of approximately 2 to $4\times10^{18}$ cm$^{-3}$.

With the above-described structure, electrons originating from the donor impurity of the n+ AlGaAs layers which are the electron supply layers 33 move toward the channel layer 35, whereby a channel serving as a current path is formed. As a result, electrons and donor ions are spatially separated at the heterojunction interface as a boundary. Electrons travel in the channel layer 35. However, since no donor ions exist in the channel layer 35, there is only a small influence of Coulomb scattering. Thus, a high electron mobility can be ensured.

An operating region 100 of the HEMTs is isolated by an insulating region 50 reaching the buffer layer 32. Hereinafter, the operating region 100 of the HEMTs is a semiconductor layer in a region which is isolated by the insulating region 50 and in which source electrodes 13 and 15, drain electrodes 14 and 16, and gate electrodes 17 of the HEMTs are placed. That is, the operating region 100 is a total region including all of semiconductor layers, such as the electron supply layers 33, the channel (electron transit) layer 35, the spacer layers 34, the barrier layer 36, and the cap layer 37, which constitute the HEMTs.

The insulating region 50 is not completely electrically insulator but is a region which is insulated by providing a carrier trap in an epitaxial layer by the implantation of impurity (B+) ions. That is, although an impurity also exists as the epitaxial layer in the insulating region 50, the impurity is inactivated by the implantation of B+ for insulation.

That is, the operating region 100 of the HEMTs is isolated by forming the insulating region 50 in the outer periphery of the region indicated by dashed-dotted lines of FIG. 2A.

As illustrated in FIG. 5A, in the operating region 100, the cap layer 37 to which an impurity is added at high concentration is partially removed, thus providing source regions 37s and a drain region 37d. The source electrodes 13 and the drain electrode 14 which are formed by an ohmic metal layer 10 of a first metal layer are connected to the source regions 37s and the drain region 37d. In a layer thereon, the source and drain electrodes 15 and 16 are formed by a pad metal layer 30.

Further, the cap layer 37 in a portion of the operating region 100 in which the gate electrodes 17 are placed is removed by etching, whereby the undoped AlGaAs layer 36 is exposed. Thus, the gate electrodes 17 are formed in which a gate metal layer 20 of a second metal layer forms a Schottky contact to the undoped AlGaAs layer 36.

The epitaxial structures of the HEMTs include the cap layer 37. The impurity concentration of the cap layer 37 is as high as approximately 1 to $5 \times 10^{18}$ cm$^{-3}$. Accordingly, it can be said that a region in which the cap layer 37 is placed is an impurity region of high concentration in terms of functions.

That is, in the case of the HEMTs, peripheral impurity regions 150 around pads and wirings are also isolated by the insulating regions 50. Further, a first control resistor CR1 (or a second control resistor CR2) is also isolated by the insulating region 50 while a distance (length) and a width are ensured so that the first control resistor CR1 (or the second control resistor CR2) has a desired resistance value.

In this embodiment, impurity regions for the case of the HEMTs are conductive regions which are not insulated by the implantation of B+.

FIG. 5B is a cross-sectional view taken along line b-b of FIG. 2A.

As in the first embodiment, low-resistance elements LR1 and LR2 respectively constituting the first and second control resistors CR1 and CR2 are placed so as to be spaced from the peripheral impurity region 150 of a common input terminal pad I by 4 μm (see FIG. 2A).

Thus, the low-resistance element LR1 (or LR2) serves as a first conduction region (a first n+ region) 201 of a protecting element 200, and the peripheral impurity region 150 adjacent thereto serves as a second conduction region (a second n+ region) 202 of the protecting element 200. Here, as described previously, in the case of the HEMTs, conductive regions (impurity regions) are isolated by forming the insulating regions 50 into desired patterns. That is, the insulating region 50 is placed around an impurity region, and the insulating region 50 becomes an insulating region 203 of the protecting element 200.

That is, the protecting element 200 having an n+/i/n+ structure is connected between a common input terminal IN and a control terminal Ctl1, i.e., between a source terminal S and a gate terminal G (or a drain terminal D and the gate terminal G) of FET1. Thus, the electrostatic breakdown voltage of the switch MMIC can be greatly improved.

Further, the low-resistance element LR1 is placed near a first output terminal pad O1. Thus, the protecting element 200 is connected between the first control terminal Ctl1 and a first output terminal OUT1. This makes it possible to improve the minimum value of the electrostatic breakdown voltage of the switch MMIC.

Further, high-resistance elements HR1 and HR1 are connected as parts of the first control resistor CR1 and a second control resistor CR2, respectively. The FET2 side is similar to the FET1 side, and therefore will not be described below.

The high-resistance element HR1 is connected between a first control terminal pad C1 and the protecting element 200 immediately near the first control terminal pad C1 in series with the low-resistance element LR1 partially constituting the first control resistor CR1.

Figure 6A:
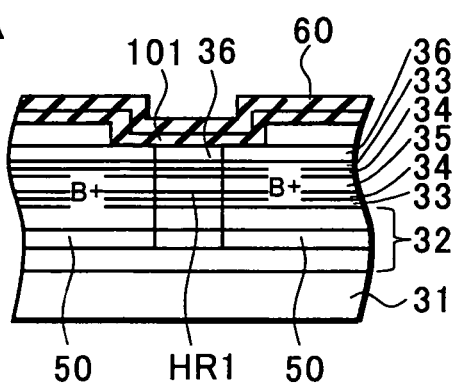
FIG. 6 is a cross-sectional view for explaining the second embodiment of the present invention.
Figure 6B:
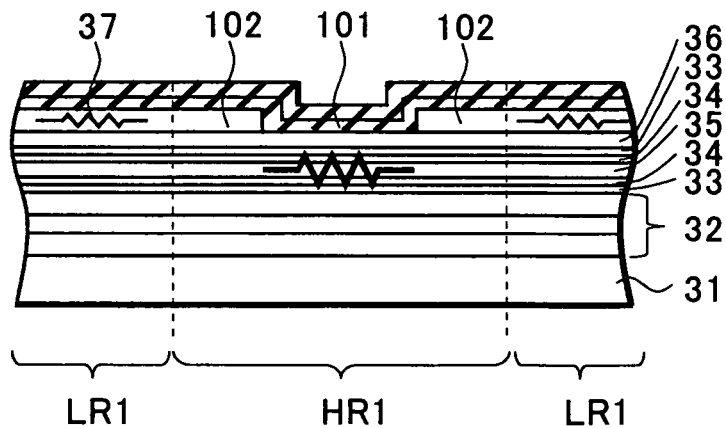

Referring to FIGS. 6A and 6B, the high-resistance elements of the second embodiment will be described. FIG. 6A is a cross-sectional view taken along line c-c of FIG. 2A, and FIG. 6B is a cross-sectional view taken along line d-d of FIG. 2A. Further, since the high-resistance elements HR1 and HR2 have similar structures.

The high-resistance element HR1 of this embodiment is a third conduction region isolated by the insulating region 50 and is constituted by a region in which the semiconductor layer under the cap layer 37 is exposed by removing the cap layer 37.

That is, the high-resistance element HR1 has a recess portion 101 in which the cap layer 37 is etched, and the cap layer 37 which serves as contact portions 102 for connection is left at both ends of the recess portion 101. The contact portions 102 are regions for continuously connecting directly to the cap layer 37 of the low-resistance element LR1 as illustrated in FIG. 6B or for connecting to wiring in the case where resistance element electrodes (not shown) are provided. In the case where the resistance element electrodes are provided, the resistance element electrodes can be formed by the ohmic metal layer 10, which is a first metal layer of the HEMTs, and the pad metal layer 30, which is a third metal layer thereof, similarly to the source and drain electrodes.

It should be noted that in the case where the contact portions 102 of the high-resistance element HR1 are connected to the low-resistance element LR1 as illustrated in FIG. 6B, the boundaries thereof are unclear. Here, minimum regions (here, e.g., regions having lengths of approximately 3 μm) required for the resistance element electrodes to come into contact therewith are regarded as the contact portions 102.

Further, in the case illustrated in FIG. 6B, the barrier layer 36 is exposed at a bottom portion of the recess portion 101. Thus, by providing the recess portion 101 in which the barrier layer 36 is exposed, the contact portions 102 and the channel layer 35 serve as a current path of the high-resistance element HR1, and the channel layer 35 substantially serve as a resistive layer of the high-resistance element HR1. Further, since the channel layer 35 has a sheet resistance (e.g., 400 Ω/sq.) several times higher than that of the cap layer 37, the high-resistance element HR1 having a high resistance value and a short length can be obtained. In this embodiment, the high-resistance element HR1 having a sheet resistance Rs of approximately 400 Ω/sq. is obtained by providing the recess portion 101. The recess portion 101 has a length of, for example, approximately 50 μm.

Thus, even if a high-frequency analog signal leaks from the common input terminal pad I to the low-resistance element LR1 near the common input terminal pad I, the leaked signal is attenuated by the high-resistance element HR1 of not less than approximately 5 kΩ. Accordingly, the leaked high-frequency signal actually does not reach the first control terminal pad C1. Accordingly, a high-frequency signal from the common input terminal pad I does not leak to the first control terminal pad C1, which is at GND potential for high frequencies. That is, an increase in insertion loss between the common input terminal IN and the first output terminal OUT1 can be suppressed.

On the other hand, the low-resistance element LR1 is isolated by the insulating region 50 as illustrated in FIG. 6A while a required distance (length) and a required width are ensured (See FIG. 6B). In the low-resistance element LR1, the cap layer 37 is left as it is. Accordingly, the contact portions 102 of the high-resistance element HR1 and the cap layer 37 become continuous.

The structure of the conductive region (impurity region) constituting the low-resistance element LR1 is the same as the epitaxial structures of the HEMTs. Accordingly, the low-resistance element LR1 includes the cap layer 37 (having an impurity concentration of approximately 1 to $5 \times 10^{18}$ cm$^{-3}$), and can be said to be an impurity region of high concentration in terms of functions.

Since the cap layer 37 has a high impurity concentration and a large thickness, the cap layer 37 becomes a major current path of the low-resistance element LR1. Here, the sheet resistance Rs is assumed to be approximately 100 Ω/sq.

In order to obtain a high resistance value (not less than 5 kΩ) using only the low-resistance element LR1, it is necessary to sufficiently reduce the width thereof or to ensure a sufficient length. In actual cases, since there are limitations on the fining of patterning, it is necessary to ensure a desired resistance value by ensuring the length. Accordingly, if a resistance increases, a resistor cannot be contained in a space between pads and another components of the switch MMIC on the chip, and there arises the necessity of preparing a special space only for placing the resistor. Thus, there is the problem that the chip area is increased.

That is, if an attempt is made to construct a resistor of not less than 5 kΩ using only the low-resistance element LR1 (or LR2), the resistor of not less than 5 kΩ cannot be contained in a space on a path from the first control terminal pad C1 to the corresponding connection point CP or a path from the second control terminal pad C2 to the corresponding connection point CP. Accordingly, in this embodiment, the high-resistance element HR1 (or HR2) is adopted. The high-resistance element HR1 (or HR2) has the channel layer 35 which has a high sheet resistance as a substantial resistive layer. Thus, the resistor of not less than 5 kΩ can be sufficiently contained in a space on a path from the first control terminal pad C1 to the corresponding connection point CP or a path from the second control terminal pad C2 to the corresponding connection point CP. This eliminates the necessity of particularly increasing the chip size. That is, a high-frequency analog signal can be attenuated while an increase in the chip area is suppressed in spite of the high resistance value.

FIGS. 7A to 7C illustrate a third embodiment of the present invention. FIG. 7A is a cross-sectional view taken along line d-d of FIG. 2A, FIG. 7B is a cross-sectional view taken along line b-b thereof, and FIG. 7C is a cross-sectional view taken along line a-a thereof.

The third embodiment has a structure in which an InGaP layer 40 is provided on a barrier layer 36 which is the same as second embodiment and in which the InGaP layer 40 is exposed at bottom portions of the recess portions 101 of high-resistance element HR1 (or HR2).

Thus, the barrier layer 36 which is an AlGaAs layer that is prone to being oxidized is covered with the InGaP layer 40 of which surface state is stable. Accordingly, the high-resistance elements having more favorable reliability than those of the second embodiment can be obtained.

Further, when the recess portions 101 are formed, a GaAs cap layer 37 can be easily selectively etched by wet etching with very high selectivity over the InGaP layer. Accordingly, the inexpensive recess portions 101 having good reproducibility can be formed.

Moreover, in this case, in an operating region 100, the barrier layer 36 is exposed by removing the InGaP layer 40, thus forming gate electrodes 17. At this time, the barrier layer 36 can be protected by the InGaP layer 40 immediately before the evaporation of a gate metal layer 20. Accordingly, characteristics of the HEMTs can be improved.

FIGS. 8A to 8C illustrate a fourth embodiment of the present invention. FIG. 8A is a cross-sectional view taken along line d-d of FIG. 2A, FIG. 8B is a cross-sectional view taken along line b-b thereof, and FIG. 8C is a cross-sectional view taken along line a-a thereof.

In the fourth embodiment, an InGaP layer 40 is provided on a barrier layer 36 which is the same as the second embodiment, and recess portions 101 are provided by etching a cap layer 37 and the InGaP layer 40. That is, the fourth embodiment has a structure in which the barrier layer 36 is exposed at a bottom portion of the recess portion 101 of high-resistance element HR1 (or HR2).

In the third embodiment in which the InGaP layer 40 is similarly provided, since the InGaP layer 40 of high concentration also constitutes a resistive layer as well as a channel layer 35, there is the problem that the sheet resistance is slightly lower than that of the second embodiment. On the other hand, in the fourth embodiment, since the InGaP layer 40 of high concentration is also removed in the recess portions 101, a resistive layer including almost only the channel layer 35 can be substantially obtained as in the second embodiment. Accordingly, the sheet resistance is comparable to that of the second embodiment. Thus, the sheet resistance value can be improved compared to that of the third embodiment. That is, a higher resistance value can be obtained with the same length and width as those of the third embodiment.

Further, in this case, in an operating region 100, the barrier layer 36 is exposed by removing the InGaP layer 40, thus forming gate electrodes 17. The barrier layer 36 can be protected by the InGaP layer 40 immediately before the evaporation of a gate metal layer 20. Accordingly, characteristics of the HEMTs can be improved.

Embodiments described below are switch MMICs having different patterns. It should be noted that the same components as those of FIG. 2A are denoted by the same reference numerals.

Figure 9:
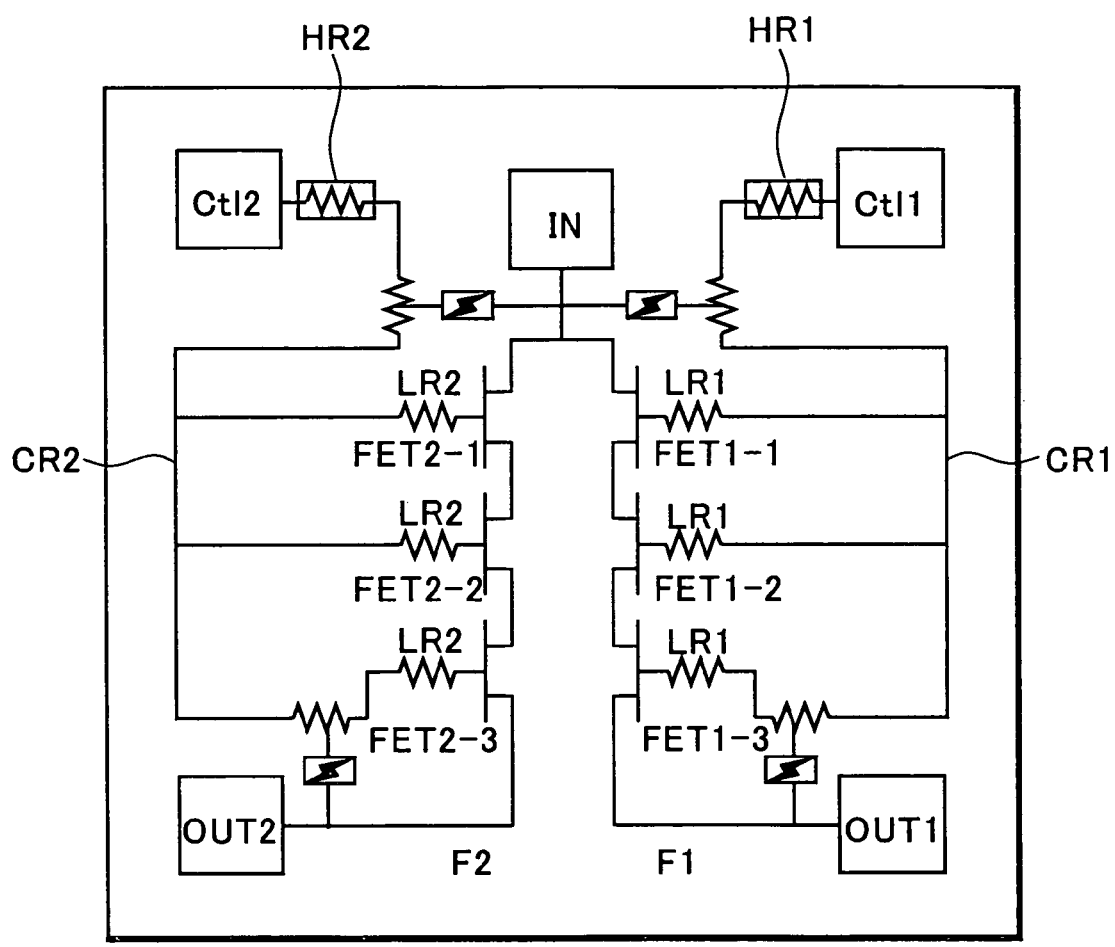
FIG. 9 is a circuit diagram for explaining a fifth embodiment of the present invention.
Figure 10:
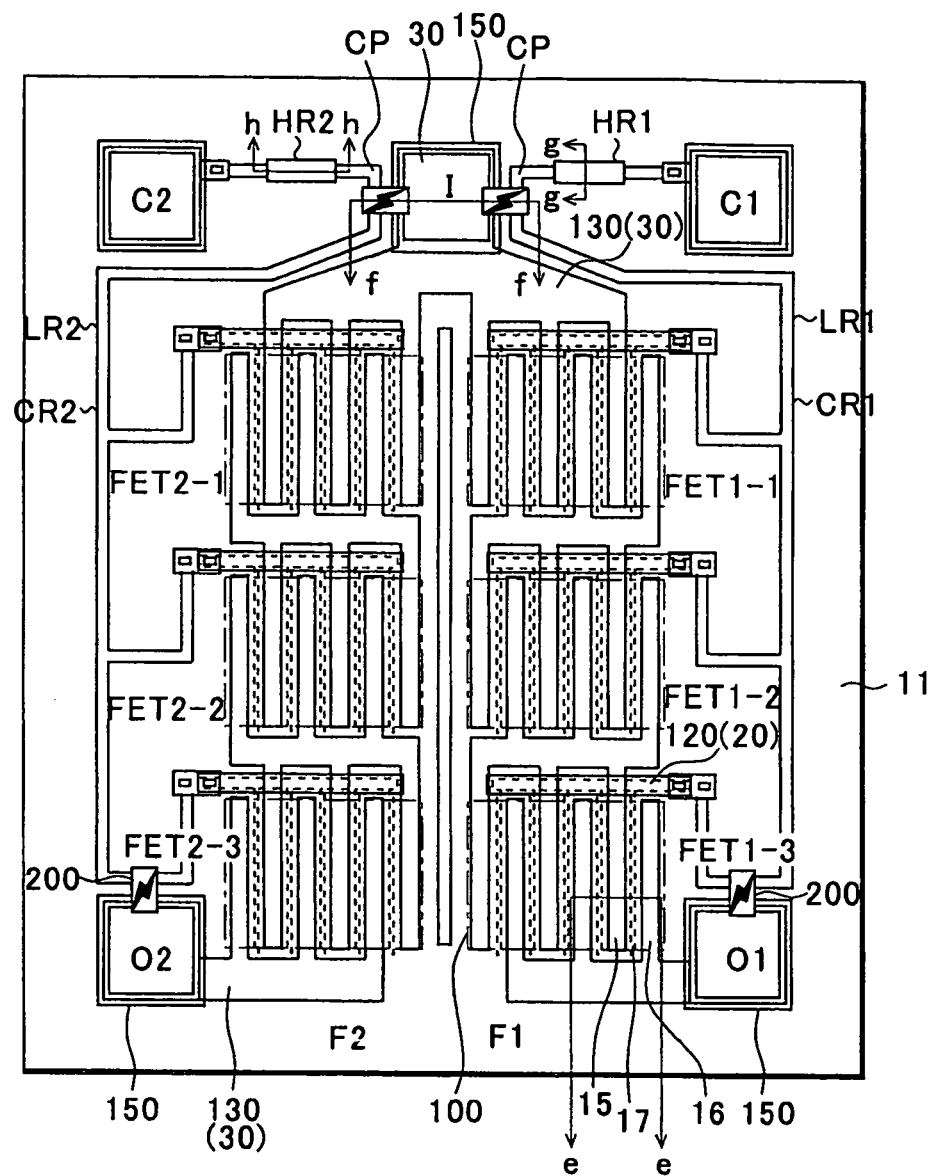
FIG. 10 is a plan view for explaining the fifth embodiment of the present invention.

FIGS. 9 to 10 illustrate high-power SPDT switch MMICs including two switching elements, each of which includes a plurality of stages of FETs connected. FIG. 9 is a circuit diagram illustrating one example of a switch MMIC of a fifth embodiment.

The switch MMIC includes a first FET group F1 and a second FET group F2, each of which includes three stages of FETs connected in series. Further, a source electrode (or a drain electrode) of the FET at one end of the first FET group F1 and a source electrode (or a drain electrode) of the FET at one end of the second FET group F2 are connected to a common input terminal IN. Moreover, gate electrodes of the three FETs of the first FET group F1 are respectively connected to a first control terminal Ctl1 through a first control resistor CR1, and three gate electrodes of the second FET group F2 are respectively connected to a second control terminal Ctl2 through a second control resistor CR2. Furthermore, a drain electrode (or a source electrode) of the FET at the other end of the first FET group F1 is connected to a first output terminal OUT1, and a drain electrode (or a source electrode) of the FET at the other end of the second FET group F2 is connected to a second output terminal OUT2.

Control signals applied to the first and second control terminals Ctl1 and Ctl2 are complementary signals. Of the FET groups, one to which an H-level signal is applied is turned on, whereby a high-frequency analog signal inputted to the common input terminal IN is transmitted to either of the output terminals. The resistors are placed in order to prevent high-frequency signals from leaking through the gate electrodes to the DC potentials of the control terminals Ctl1 and Ctl2, which are AC grounded.

As described above, in the first FET group F1 including a plurality of stages of FETs connected in series, the source electrode of FET1-1 as a source of the FET group F1 is connected to the common input terminal IN. The gate electrodes of FET1-1, FET1-2, and FET1-3 as gates of the FET group F1 are collectively connected to the control terminal Ctl1. The drain electrode of FET1-3 as a drain of the FET group F1 is connected to the output terminal OUT1. The second FET group F2 has a similar configuration.

FIG. 10 is a plan view of a switch MMIC in which the circuit of FIG. 9 is integrated into one chip. The two FET groups (first and second FET groups F1 and F2) which perform switching are placed in a GaAs substrate 11. The first FET group F1 includes, for example, three FETs FET1-1, FET1-2, and FET1-3 connected in series. The second FET group F2 includes FET2-1, FET2-2, and FET2-3 connected in series. The first control resistor CR1 and the second control resistor CR2 are connected to the six gate electrodes constituting each of the FET groups, respectively. Electrode pads I, O1, and O2 respectively connected to the common input terminal IN and the first and second output terminals OUT1 and OUT2, and two electrode pads C1 and C2 respectively connected to the first and second control terminals Ctl1 and Ctl2, are provided in a peripheral portion of the substrate 11.

Gate wirings 120 of a second metal layer indicated by dotted lines are constituted by a gate metal layer (e.g., Pt/Mo) 20 formed simultaneously with the formation of gate electrodes 17 of the FETs. Pad wirings 130 of a third metal layer indicated by full lines are constituted by a pad meal layer (Ti/Pt/Au) 30 which connects components and forms the electrode pads. An ohmic metal layer (AuGe/Ni/Au), which is a first metal layer, forms an ohmic contact to the substrate 11. In FIG. 10, the ohmic metal layer is not illustrated because it is overlapped by the pad metal layer 30.

The first FET group F1 is placed to be symmetric with the second FET group F2 with respect to a center line of the chip, and the first and second FET groups F1 and F2 have similar configurations. Accordingly, the first FET group F1 will be described below. In FET1-1, three comb-teeth-like portions of the pad metal layer 30 which are extended from the upper side constitute second source electrodes 15 (or second drain electrodes 16) connected to the common input terminal pad I. Under the second source electrodes 15, there are first source electrodes (or first drain electrodes) formed by the ohmic metal layer. Further, three comb-teeth-like portions of the pad metal layer 30 which are extended from the lower side constitute second drain electrodes 16 (or second source electrodes 15) of FET1-1. Under the second drain electrodes 16, there are first drain electrodes (or first source electrodes) formed by the ohmic metal layer. The second source and drain electrodes 15 and 16 are placed in a shape in which the comb-teeth-like portions are engaged. A gate electrode 17 formed by the gate metal layer 20 is placed therebetween in a shape having five comb-teeth-like portions.

Operating regions 100 are formed in regions indicated by dashed-dotted lines by, for example, implanting ions into the GaAs substrate 11. Alternatively, the operating regions 100 are formed in the regions indicated by the dashed-dotted lines by stacking a plurality of semiconductor layers on the GaAs substrate 11 and being isolated by insulating regions 50.

In FET1-2, three second source electrodes 15 extended from the upper side are connected to the second drain electrodes 16 of FET1-1. Here, the second source electrodes 15 are merely via points for a high-frequency signal, and generally do not need to be led to the outside. Accordingly, no pad is provided for these electrodes. Further, three second drain electrodes 16 extended from the lower side are connected to second source electrodes 15 of FET1-3. The second drain electrodes 16 are also merely via points for a high-frequency signal, and generally do not need to be led to the outside. Accordingly, no pad is provided for these electrodes. Under the second source and drain electrodes 15 and 16, there is the ohmic metal layer. The second source and drain electrodes 15 and 16 are placed in a shape in which the comb-teeth-like portions are engaged. A gate electrode 17 formed by the gate metal layer 20 is placed therebetween in a shape having five comb-teeth-like portions. Compared to a switch circuit device including one stage of an FET, the switch circuit device including a plurality of stages of FETs connected in series is a high-power switch circuit device because each FET group can withstand a larger voltage amplitude when the FET group is off. In this case, source and drain electrodes of the FETs which become junctions when the FETs are connected in series generally do not need to be led to the outside. Accordingly, there is no need to provide pads for such source and drain electrodes.

In FET1-3, three comb-teeth-like portions of the pad metal layer 30 which are extended from the upper side constitute second source electrodes 15. Under the second source electrodes 15, there are source electrodes formed by the ohmic metal layer. Further, three comb-teeth-like portions of the pad metal layer 30 which are extended from the lower side constitute second drain electrodes 16 connected to the output terminal pad O1. Under the second drain electrodes 16, there are drain electrodes formed by the ohmic metal layer. The second source and drain electrodes 15 and 16 are placed in a shape in which the comb-teeth-like portions are engaged. A gate electrode 17 formed by the gate metal layer 20 is placed therebetween in a shape having five comb-teeth-like portions.

It should be noted that a cross-sectional view taken along line e-e in FIG. 10 is similar to FIG. 2B in the case of FETs in which the operating regions 100 are formed by ion implantation or similar to FIG. 5A in the case of HEMTs.

The comb-teeth-like portions of the gate electrodes 17 of the FETs of the first FET group F1 are respectively bundled by the gate wirings 120 formed by the gate metal layer 20 outside the operating region 100, and are connected to the first control terminal pad C1 through the first control resistor CR1.

The first control resistor CR1 includes a low-resistance element LR1. High-resistance element HR1 is connected in series with portions of the low-resistance element LR1.

Further, the low-resistance element LR1 of the first control resistor CR1 is placed along and near the common input terminal pad I. Thus, a protecting element 200 is connected between the common input terminal pad I and the first control terminal pad C1. It should be noted that a cross-sectional view taken along line f-f of FIG. 10 is similar to FIG. 3C or 5B. Thus, electrostatic breakdown voltage can be greatly improved.

Moreover, the low-resistance element LR1 is placed near the first output terminal pad O1. Thus, another protecting element 200 is connected between the first control terminal Ctl1 and the first output terminal OUT1. Thus, it is possible to improve the minimum value of the electrostatic breakdown voltage of the switch circuit device.

A high-resistance element HR1 is connected between the first control terminal pad C1 and the protecting element 200 closest to the first control terminal pad C1, immediately near the first control terminal pad C1.

A cross-sectional view of the high-resistance element HR1 which is taken along line g-g of FIG. 10 is similar to FIG. 4 or 6A. That is, the high-resistance element HR1 for the case (FIG. 4) of FETs in which the operating regions 100 are formed by ion implantation is formed to have a resistance value of not less than 5 kΩ by implanting ions of the same impurity as that forming a channel layer 12 into the GaAs substrate 11 so that a peak concentration comparable to that of the channel layer 12 is obtained.

On the other hand, the high-resistance element HR1 for the case (FIG. 6A) of HEMTs is isolated from the surrounding region by an insulating region 50 and formed to have a resistance value of not less than 5 kΩ by forming a recess portion 101 by etching a cap layer 37. In the case of the HEMTs, a cross-sectional view taken along line h-h of FIG. 10 is similar to FIG. 6B. As illustrated in FIG. 6B, a semiconductor layer under the recess portion 101 is exposed in the recess portion 101. Since semiconductor layers under the cap layer 37 serve as resistive layers, a high resistance value can be obtained with a short distance.

If a resistor of not less than 5 kΩ is constructed using only the low-resistance element LR1, the resistor of not less than 5 kΩ cannot be contained in a space on a path from the connection point CP to the first control terminal pad C1. A resistor of not less than 5 kΩ can be placed without particularly increasing the chip size by constructing this resistor using the high-resistance element HR1 as in this embodiment.

Further, the high-resistance element HR1 is connected on a path from the first control terminal pad C1 to the protecting element 200 connected at a position closest to the first control terminal pad C1.

Thus, even if a high-frequency analog signal inputted to the common input terminal pad I leaks to the low-resistance element LR1, the high-frequency analog signal can be attenuated by the high-resistance element HR1. This substantially eliminates the possibility of a high-frequency analog signal leaking to the first control terminal pad C1. Thus, it is possible to suppress an increase in insertion loss between the common input terminal IN and the first output terminal OUT1.

Further, the substrate structure and the high-resistance element HR1 (or HR2) for the case of HEMTs may be similar to those of the third or fourth embodiment.

Figure 11:
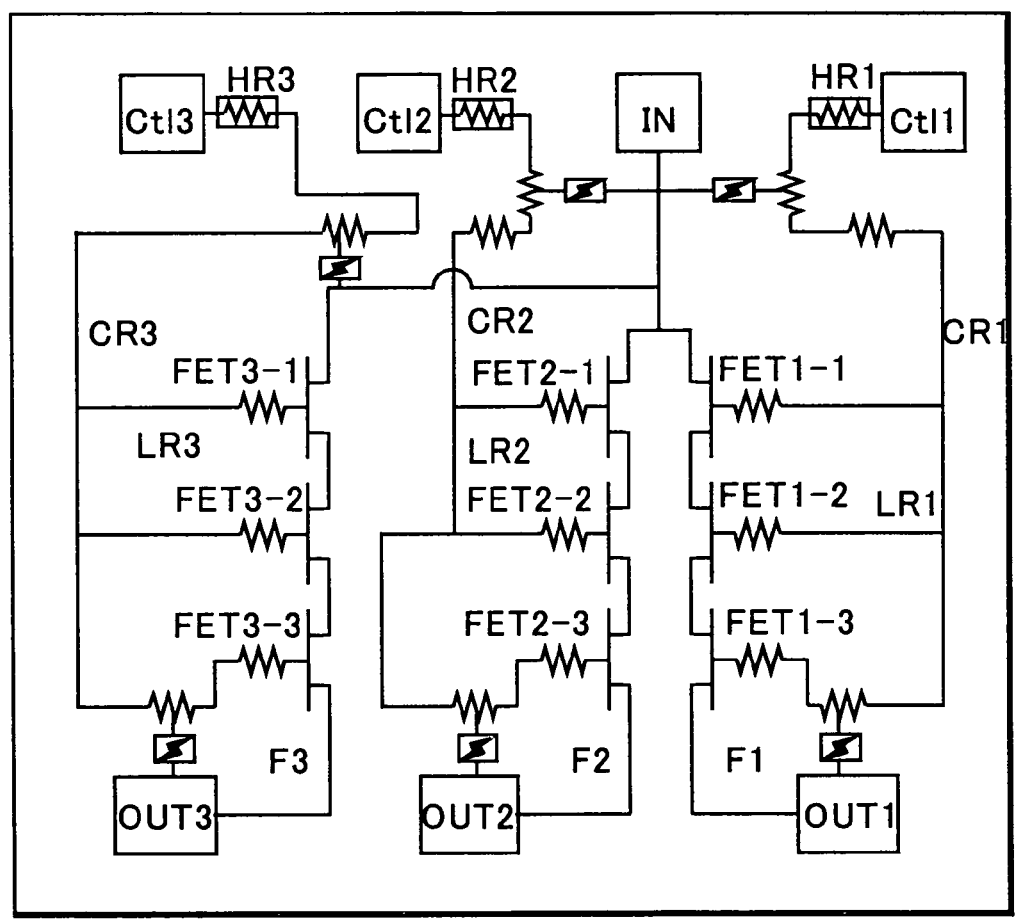
FIG. 11 is a circuit diagram for explaining a sixth embodiment of the present invention.

FIGS. 11 to 12 illustrate a single-pole three-throw (SP3T) switch including three switching elements. FIG. 11 is a circuit diagram illustrating one example of a switch MMIC of a sixth embodiment.

The switch MMIC includes a first FET group F1, a second FET group F2, and a third FET group F3, each of which includes three stages of FETs connected in series and serves as a switching element. Further, a source electrode (or a drain electrode) of the FET at one end of the first FET group F1, a source electrode (or a drain electrode) of the FET at one end of the second FET group F2, and a source electrode (or a drain electrode) of the FET at one end of the third FET group F3 are connected to a common input terminal IN. Moreover, gate electrodes of the three FETs of the first FET group F1 are respectively connected to a first control terminal Ctl1 through a first control resistor CR1, and three gate electrodes of the second FET group F2 are respectively connected to a second control terminal Ctl2 through a second control resistor CR2. Furthermore, three gate electrodes of the third FET group F3 are respectively connected to a third control terminal Ctl3 through a third control resistor CR3.

Further, a drain electrode (or a source electrode) of the FET at the other end of the first FET group F1 is connected to a first output terminal OUT1. Moreover, a drain electrode (or a source electrode) of the FET at the other end of the second FET group F2 is connected to a second output terminal OUT2, and a drain electrode (or a source electrode) of the FET at the other end of the third FET group F3 is connected to a third output terminal OUT3.

Of control signals applied to the first, second, and third control terminals Ctl1, Ctl2, and Ctl3, one is at an H level, and the others are at an L level. Of the FET groups, one to which an H-level signal is applied is turned on, whereby a high-frequency analog signal inputted to the common input terminal IN is transmitted to corresponding one output terminal. The resistors are placed in order to prevent high-frequency signals from leaking through the gate electrodes to the DC potentials of the control terminals Ctl1, Ctl2, and Ctl3, which are AC grounded.

Figure 12A:
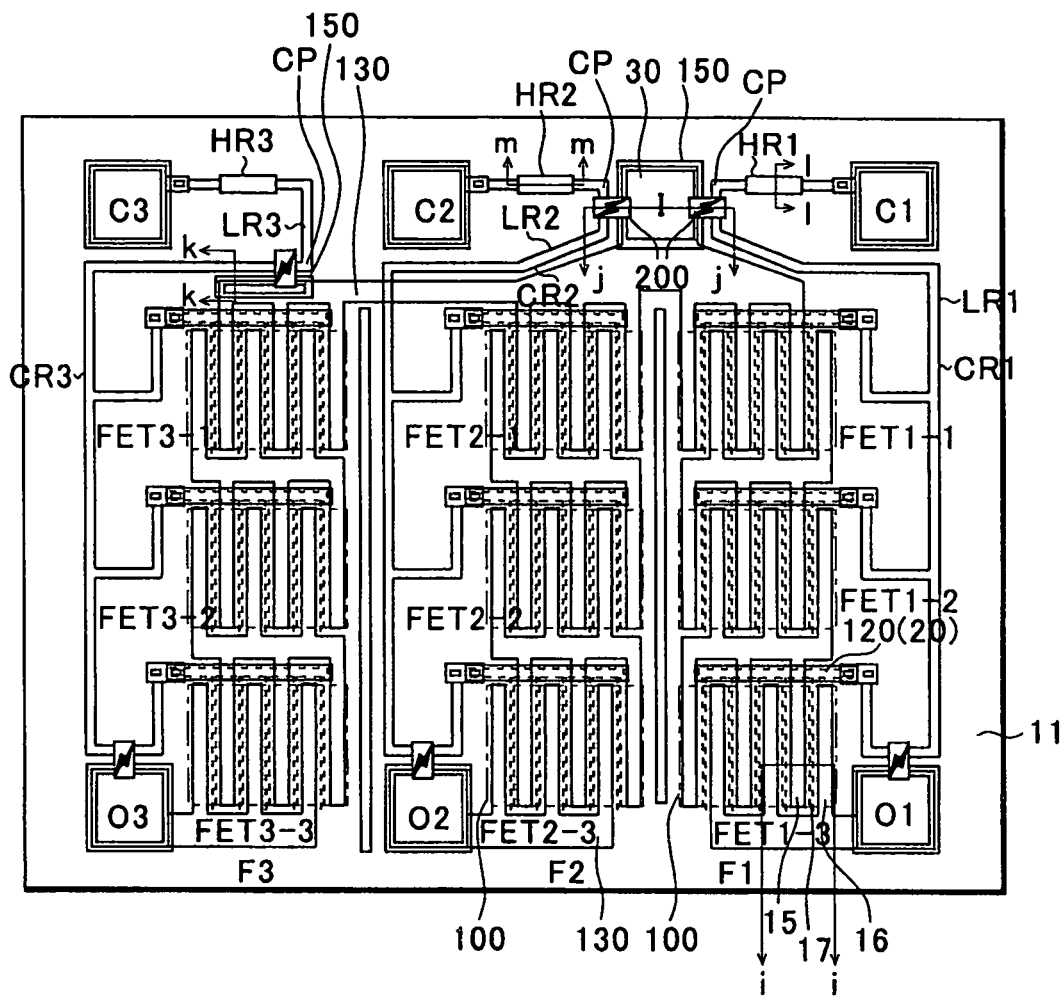
FIGS. 12A and 12B are a plan view and a cross-sectional view for explaining the sixth embodiment of the present invention, respectively.
Figure 12B:
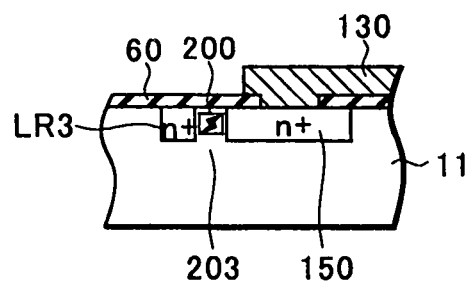
Figure 13:
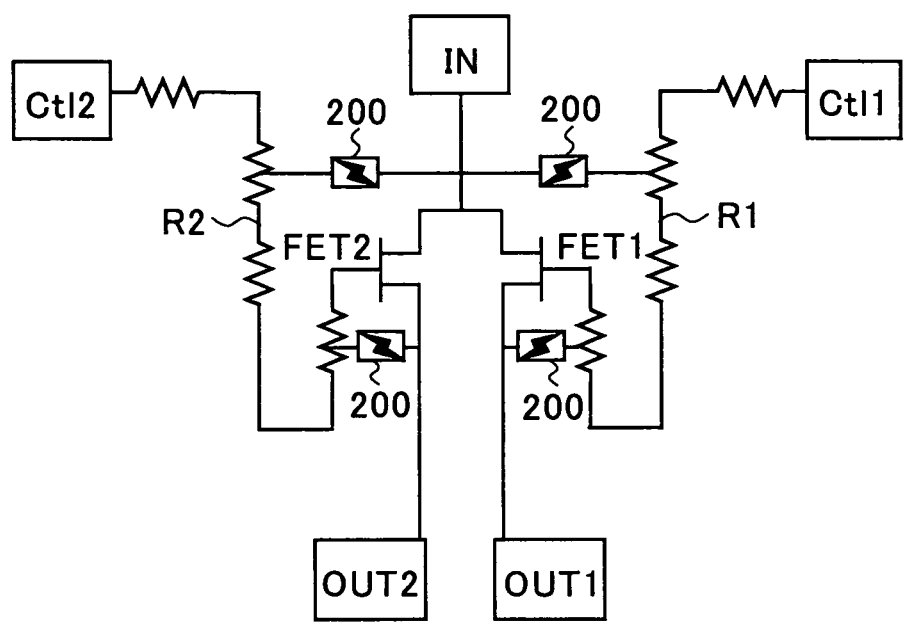
FIG. 13 is a circuit diagram for explaining a conventional technology.
Figure 14:
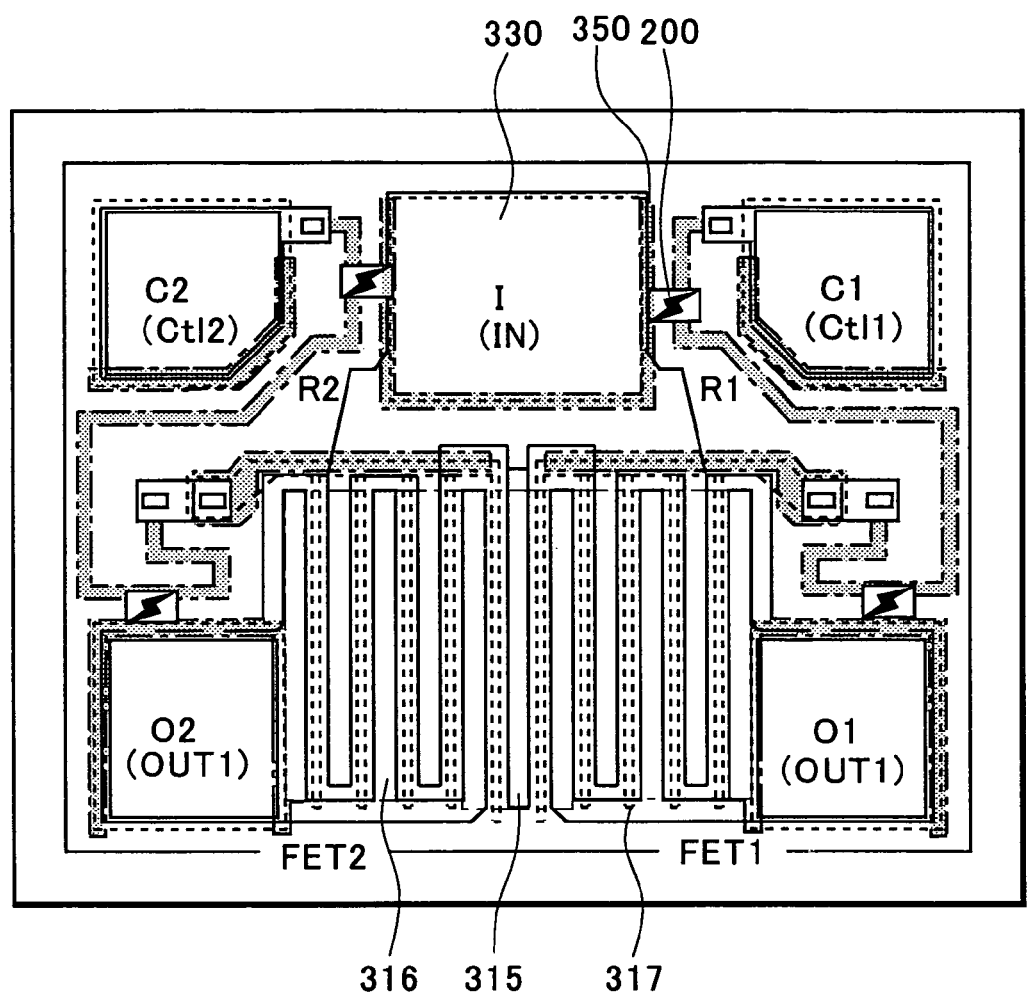
FIG. 14 is a plan view for explaining the conventional technology.

FIGS. 12A and 12B are diagrams of a switch MMIC in which the circuit of FIG. 11 is integrated into one chip. FIG. 12A is a plan view, and FIG. 12B is a cross-sectional view taken along line k-k of FIG. 12A.

The three FET groups which perform switching are placed in a GaAs substrate 11. The first FET group F1 includes, for example, three FETs FET1-1, FET1-2, and FET1-3 connected in series. The second FET group F2 includes FET2-1, FET2-2, and FET2-3 connected in series. The third FET group F3 includes FET3-1, FET3-2, and FET3-3 connected in series.

The first control resistor CR1, the second control resistor CR2, and the third control resistor CR3 are connected to nine gate electrodes 17 constituting each of the FET groups, respectively. Further, electrode pads I, O1, O2, and O3 respectively connected to the common input terminal IN and the output terminals OUT1, OUT2, and OUT3, and three electrode pads C1, C2, and C3 respectively connected to the control terminals Ctl1, Ctl2, and Ctl3, are provided in a peripheral portion of the substrate 11.

Gate wirings 120 of a second metal layer indicated by dotted lines are constituted by a gate metal layer (e.g., Pt/Mo) 20 formed simultaneously with the formation of the gate electrodes 17 of the FETs. Pad wirings 130 of a third metal layer indicated by full lines are constituted by a pad meal layer (Ti/Pt/Au) 30 which connects components and forms the pads. An ohmic metal layer (AuGe/Ni/Au), which is a first metal layer and forms an ohmic contact to the substrate 11, in FIG. 12, is not illustrated because it is overlapped by the pad metal layer 30.

The first, second, and third FET groups F1, F2, and F3 have similar configurations. Accordingly, the first FET group F1 will be mainly described below. In FET1-1, three comb-teeth-like portions of the pad metal layer 30 which are extended from the upper side constitute second source electrodes 15 (or second drain electrodes 16) connected to the common input terminal pad I. Under the second source electrodes 15, there are first source electrodes (or first drain electrodes) formed by the ohmic metal layer. Further, three comb-teeth-like portions of the pad metal layer 30 which are extended from the lower side constitute second drain electrodes 16 (or second source electrodes) of FET1-1. Under the second drain electrode 16, there are first drain electrodes (or first source electrodes) formed by the ohmic metal layer. The second source and drain electrodes 15 and 16 are placed in a shape in which the comb-teeth-like portions are engaged. A gate electrode 17 formed by the gate metal layer 20 is placed therebetween in a shape having five comb-teeth-like portions.

Operating regions 100 are formed in regions indicated by dashed-dotted lines by, for example, implanting ions into the GaAs substrate 11. Alternatively, the operating regions 100 are formed in the regions indicated by the dashed-dotted lines by stacking a plurality of semiconductor layers on the GaAs substrate and isolating the operating regions 100 with insulating regions 50.

In FET1-2, three second source electrodes 15 (or second drain electrodes 16) extended from the upper side are connected to the second drain electrodes 16 of FET1-1. Here, the second source electrodes 15 are merely via points for a high-frequency signal, and generally do not need to be led to the outside. Accordingly, no pad is provided for these electrodes. Further, three second drain electrodes 16 extended from the lower side are connected to second source electrodes 15 of FET1-3. The second drain electrodes 16 are also merely via points for a high-frequency signal, and generally do not need to be led to the outside. Accordingly, no pad is provided for these electrodes. Under the second source and drain electrodes 15 and 16, there is the ohmic metal layer. The second source and drain electrodes 15 and 16 are placed in a shape in which the comb-teeth-like portions are engaged. A gate electrode 17 formed by the gate metal layer 20 is placed therebetween in a shape having five comb-teeth-like portions. Compared to a switch circuit device including one stage of an FET, the switch circuit device including a plurality of stages of FETs connected in series is a high-power switch circuit device because each FET group can withstand a larger voltage amplitude when the FET group is off. In this case, source and drain electrodes of the FETs which become junctions when the FETs are connected in series generally do not need to be led to the outside. Accordingly, there is no need to provide pads for such source and drain electrodes.

In FET1-3, three comb-teeth-like portions of the pad metal layer 30 which are extended from the upper side constitute second source electrodes 15. Under the second source electrodes 15, there are source electrodes formed by the ohmic metal layer. Further, three comb-teeth-like portions of the pad metal layer 30 which are extended from the lower side constitute second drain electrodes 16 connected to the output terminal pad O1. Under the second drain electrodes 16, there are drain electrodes formed by the ohmic metal layer. The second source and drain electrodes 15 and 16 are placed in a shape in which the comb-teeth-like portions are engaged. A gate electrode 17 formed by the gate metal layer 20 is placed therebetween in a shape having five comb-teeth-like portions.

It should be noted that a cross-sectional view taken along line i-i in FIG. 12 is similar to FIG. 2B in the case of FETs in which the operating regions 100 are formed by ion implantation or similar to FIG. 5A in the case of HEMTs.

The comb-teeth-like portions of the gate electrodes 17 of the FETs of the first FET group F1 are respectively bundled by the gate wirings 120 formed by the gate metal layer 20 outside the operating regions 100, and are connected to the first control terminal pad C1 through the first control resistor CR1.

The first control resistor CR1 includes a low-resistance element LR1. High-resistance element HR1 is connected in series with portions of the low-resistance element LR1.

Further, the low-resistance element LR1 of the first control resistor CR1 is placed along and near the common input terminal pad I. Thus, a protecting element 200 is connected between the common input terminal pad I and the first control terminal pad C1. It should be noted that a cross-sectional view taken along line j-j of FIG. 12A is similar to FIG. 3C or 5B. Thus, electrostatic breakdown voltage can be greatly improved.

Here, as for the third FET group F3, a low-resistance element LR3 cannot be placed near the common input terminal pad I. Accordingly, the pad wiring 130 connected to the common input terminal pad I is used. That is, a peripheral impurity region 150 is provided in the vicinity of the pad wiring 130, and the low-resistance element LR3 is placed near this peripheral impurity region 150.

Thus, as illustrated in FIG. 12B, the protecting element 200 is formed by the low-resistance element LR3, the peripheral impurity region 150 of the pad wiring 130, and an insulating region 203 (the GaAs substrate 11 or the insulating region 50). It should be noted that FIG. 12B illustrates the case where ions of an n-type impurity are implanted into the GaAs substrate 11. In the case of HEMTs, the peripheral impurity region 150 and the low-resistance element LR3 are isolated by providing the insulating regions 50 around the peripheral impurity region 150 and the low-resistance element LR3.

Further, the low-resistance element LR1 is placed near the first output terminal pad O1. Thus, another protecting element 200 is connected between the first control terminal Ctl1 and the first output terminal OUT1. Thus, it is possible to improve the minimum value of the electrostatic breakdown voltage of the switch circuit device.

A high-resistance element HR1 is connected between the first control terminal pad C1 and the protecting element 200, immediately near the first control terminal pad C1.

A cross-sectional view of the high-resistance element HR1 which is taken along line 1-1 of FIG. 12A is similar to FIG. 4 or 6A. That is, the high-resistance element HR1 for the case (FIG. 4) of FETs in which the operating region 100 is formed by ion implantation, is formed to have a resistance value of not less than 5 kΩ by implanting ions of the same impurity as that forming a channel layer 12 into the GaAs substrate 11 so that a peak concentration comparable to that of the channel layer 12 is obtained.

On the other hand, the high-resistance element HR1 for the case (FIG. 6A) of HEMTs is isolated from the surrounding region by an insulating region 50 and formed to have a resistance value of not less than 5 kΩ by etching a cap layer 37. In the case of the HEMTs, a cross-sectional view taken along line m-m of FIG. 12A is similar to FIG. 6B. As illustrated in FIG. 6B, a semiconductor layer under a recess portion 101 is exposed in the recess portion 101. Since semiconductor layers under the cap layer 37 serve as resistive layers, a high resistance value can be obtained with a short distance.

If a resistor of not less than 5 kΩ is constructed using only the low-resistance element LR1 (or LR2 or LR3), the resistor of not less than 5 kΩ cannot be contained in a space on a path from the connection point CP to the first control terminal pad C1 (or second control terminal pad C2 or third control terminal pad C3). A resistor of not less than 5 kΩ can be placed without particularly increasing the chip size by constructing the resistor of not less than 5 kΩ using the high-resistance element HR1 (or HR2 or HR3) as in this embodiment.

Further, the high-resistance element HR1 is connected on a path from the first control terminal pad C1 to the protecting element 200 connected at a position closest to the first control terminal pad C1.

Thus, even if a high-frequency analog signal inputted to the common input terminal pad I leaks to the first control resistor CR1, the high-frequency analog signal can be attenuated by the high-resistance element HR1. This substantially eliminates the possibility of a high-frequency analog signal leaking to the first control terminal pad C1. Thus, it is possible to suppress an increase in insertion loss between the common input terminal IN and the first output terminal OUT1.

Further, the substrate structure and the high-resistance element HR1 (or HR2 or HR3) for the case of HEMTs may be similar to those of the third or fourth embodiment.

It should be noted that in the case where each of a first switching element F1 and a second switching element F2 (and a third switching element F3) includes a plurality of stages, the number of stages of FETs is not limited to those of the above-described examples.

It should be noted that a high-resistance element may not be an impurity-implanted region or a region in which a semiconductor layer under a cap layer is exposed by etching the cap layer. For example, a high-resistance element may be a metal resistor formed of evaporated NiCr and the like.

According to the embodiments of the present invention, the following effects can be obtained.

First, a high-resistance element of not less than 5 kΩ is connected as part of a connecting path (control resistor) to which a protecting element is connected. Further, the high-resistance element is connected between the protecting element and a control terminal pad immediately near the control terminal pad. That is, the connecting path extended from the control terminal pad to an operating region has a pattern in which the high-resistance element is connected, after that, the protecting element is connected.

Thus, even if an input signal (high-frequency analog signal) transmitting to the common input terminal pad I leaks to the control resistor R1 (or R2) through the protecting element, the leaked signal is attenuated by the high-resistance element. As a result, there is no possibility that the input signal leaks to a control terminal Ctl1 (or Ctl2), which is at GND potential for high frequencies. Accordingly, a very large effect of preventing electrostatic breakdown can be obtained without deteriorating insertion loss. Further, the high-resistance element has a short distance and a large resistance value, and can be placed around a pad. Accordingly, the high-resistance element can be connected without adding any special space.

Second, high-resistance elements are connected immediately near first and second control terminal pads, respectively. This makes it possible to reliably attenuate high-frequency signals leaking to a connecting path such as low-resistance elements respectively connected in series with the high-resistance elements. As described previously, components of an input signal (high-frequency analog signal) transmitting to a common input terminal pad which leak to control resistors through protecting elements account for a major part of the leakage of high-frequency signals. However, in practice, although small in amount, high-frequency signals also leak through a substrate to the connecting path from wirings, electrodes, an operating region, and the like in which high-frequency signals are transmitted. For example, when a high-frequency signal having a power as high as several watts transmits, the leakage components thereof are not negligible.

That is, in the case where a high-resistance element is connected at a position far from the first control terminal pad (or second control terminal pad) and a low-resistance element or a wiring or the like is connected between the high-resistance element and the first control terminal pad, a high-frequency signal leaks through the substrate to the low-resistance element or the like from wirings, electrodes, the operating region, and the like in which high-frequency signals is transmitted. Further, the leaked high-frequency signals leak to the first control terminal pad without being attenuated.

To counter this, as in the above-described embodiments, a high-resistance element is connected immediately near the first control terminal pad within a distance of 100 μm therefrom. Thus, even if there are the low-resistance element and the like through which high-frequency signals leak, the distance (distance from the high-resistance element to the first control terminal pad C1) becomes short, and the chance that high-frequency signals leak is small.

Third, in the case of an FET in which an operating region is formed by ion implantation, the high-resistance element is an implanted region and is, for example, an impurity region having a peak concentration comparable to that of a channel layer. Accordingly, the high-resistance element can be formed by the same process as that for the channel layer. A low-resistance element can be formed by the same process as that for source and drain regions of the operating region. Accordingly, the embodiment of the present invention can be carried out by merely changing a pattern for ion implantation in the operating region.

Fourth, in the case of a HEMT, the high-resistance element is a region where a semiconductor layer under a cap layer is exposed by providing a recess portion in which the cap layer is removed. By removing the cap layer having a high impurity concentration, the channel layer having a high sheet resistance becomes a major current path in a region which serves as the high-resistance element. Since the channel layer has a sheet resistance several times higher than that of the cap layer, the same resistance value can be obtained for a shorter distance than in the case where a resistive layer including the cap layer is used. Accordingly, the distance over which a resistor is routed in a chip is reduced by a factor of several. Thus, in the case where a resistor having a high resistance is connected, an increase in the chip area can be suppressed. Further, since the recess portion can be formed simultaneously with an alignment mark formation step in which the cap layer is removed, the high-resistance element can be formed without newly adding a step in particular.

Fifth, by providing an InGaP layer on a barrier layer, the InGaP layer can be used as an etch stop layer. Thus, the stability of a process can be improved.

Sixth, by providing the InGaP layer on the barrier layer and exposing the InGaP layer of which surface is stable, at a bottom portion of the recess portion, the channel layer under the InGaP layer can be reliably protected, and reliability can be improved.

Seventh, by removing the cap layer so that the barrier layer is exposed at the bottom portion of the recess portion, a resistive layer can be reliably formed in which almost only the channel layer becomes a major current path.

Further, in the case where the InGaP layer used as an etch stop layer on the barrier layer is doped with an impurity, the sheet resistance of a resistive element can be further improved by removing even the InGaP layer so that the bottom portion of the recess portion serves as the barrier layer.

What is claimed is:

1. A compound semiconductor switch circuit device comprising:
   two or more switching elements formed on a compound semiconductor substrate, each of the switching elements comprising at least one gate, a signal input portion and a signal output portion;
   a common input terminal pad formed on the substrate and connected with the signal input portions of the switching elements;
   an output terminal pad provided for each of the switching elements and connected with a corresponding signal output portion, the output terminal pads being formed on the substrate;
   a control terminal pad provided for each of the switching elements and connected with a corresponding gate, the control terminal pads being formed on the substrate;
   a connecting path connecting one of the control terminal pads and a corresponding gate; and
   a protecting element connected between the common input terminal pad and the connecting path and comprising a first conduction region, a second conduction region and an insulating region disposed between the first and second conduction regions,
   wherein the connecting path comprises a high-resistance element that has a resistance higher than an average resistance of the connecting path and is disposed between the protecting element and the control terminal pad with which the connecting path is connected.

2. The compound semiconductor switch circuit device of claim 1, wherein the high-resistance element is disposed within 100 μm from the control terminal pad with which the connecting path is connected.

3. The compound semiconductor switch circuit device of claim 1, wherein the high-resistance element comprises a third conduction region.

4. The compound semiconductor switch circuit device of claim 3, wherein each of the switching elements comprises a filed effect transistor comprising a channel layer comprising a first doped impurity region formed in the substrate, and the third conduction region comprises a second doped impurity region formed in the substrate that has an impurity concentration equal to an impurity concentration of the first doped impurity region.

5. The compound semiconductor switch circuit device of claim 3, wherein each of the switching elements comprises an HEMT comprising a stack of a buffer layer, an electron supply layer, a channel layer, a barrier layer and a cap layer, and the third conduction region comprises a portion of the stack that does not include the cap layer.

6. The compound semiconductor switch circuit device of claim 5, wherein a sheet resistance of the third conduction region is higher than a sheet resistance of the cap layer.

7. The compound semiconductor switch circuit device of claim 5, wherein the upper most layer of the third conduction region is the barrier layer.

8. The compound semiconductor switch circuit device of claim 5, wherein an InGaP layer is disposed on the barrier layer, and the InGaP layer is the upper most layer of the third conduction region.

9. The compound semiconductor switch circuit device of claim 1, wherein the high-resistance element has a resistance higher than 5 k$\Omega$.

10. The compound semiconductor switch circuit device of claim 1, wherein part of the connecting path is configured to operate as the first conduction region of the protecting element.

11. The compound semiconductor switch circuit device of claim 10, wherein a third conduction region is disposed adjacent an edge portion of the common input terminal pad or an edge portion of a pad wiring connected with the common input terminal pad, and part of the third conduction region is configured to operate as the second conduction region of the protecting element.

12. The compound semiconductor switch circuit device of claim 1, wherein the common input terminal pad is configured to receive a high-frequency analog signal.

* * * * *